United States Patent
Heo et al.

(10) Patent No.: US 11,145,687 B2
(45) Date of Patent: Oct. 12, 2021

(54) DISPLAY HAVING INFRARED ELEMENT ARRANGED SUCH THAT AT LEAST ONE PORTION THEREOF OVERLAPS PIXEL, AND ELECTRONIC DEVICE INCLUDING SAME

(71) Applicant: SAMSUNG ELECTRONICS CO., LTD., Gyeonggi-do (KR)

(72) Inventors: Changryong Heo, Gyeonggi-do (KR); Minuk Kim, Gyeonggi-do (KR); Valeriy Prushinskiy, Gyeonggi-do (KR); Chihyun Cho, Gyeonggi-do (KR)

(73) Assignee: Samsung Eletronics Co., Ltd

( * ) Notice: Subject to any disclaimer, the term of this patent is extended or adjusted under 35 U.S.C. 154(b) by 0 days.

(21) Appl. No.: 16/964,093

(22) PCT Filed: Jan. 22, 2019

(86) PCT No.: PCT/KR2019/000899
§ 371 (c)(1),
(2) Date: Jul. 22, 2020

(87) PCT Pub. No.: WO2019/146995
PCT Pub. Date: Aug. 1, 2019

(65) Prior Publication Data
US 2021/0036047 A1     Feb. 4, 2021

(30) Foreign Application Priority Data

Jan. 23, 2018  (KR) ........................ 10-2018-0008359

(51) Int. Cl.
*H01L 27/146* (2006.01)
*G06F 3/041* (2006.01)
(Continued)

(52) U.S. Cl.
CPC ...... *H01L 27/14652* (2013.01); *G06F 3/0412* (2013.01); *G06K 9/0004* (2013.01); *H01L 27/323* (2013.01)

(58) Field of Classification Search
CPC ............. H01L 27/3209; H01L 51/5278; H01L 27/323; H01L 27/3234; H01L 27/14652;
(Continued)

(56) References Cited

U.S. PATENT DOCUMENTS 9,093,382 B2   7/2015  Liu et al.
9,570,002 B2   2/2017  Sakariya et al.
(Continued)

FOREIGN PATENT DOCUMENTS

CN    107004130    8/2017
EP    2 432 196    3/2012
(Continued)

OTHER PUBLICATIONS

European Search Report dated Feb. 16, 2021 issued in counterpart application No. 19744533.1-1216, 10 pages.
(Continued)

*Primary Examiner* — Charles V Hicks
(74) *Attorney, Agent, or Firm* — The Farrell Law Firm, P.C.

(57) ABSTRACT

Various embodiments of the present document relate to a display and, particularly, relate to a display including infrared elements, and an electronic device including the same. The display according to various embodiments of the present document includes a substrate; a first element for outputting light of a first visible light band and a second element for outputting light of an infrared band, the elements being formed on the substrate; and a third element for outputting
(Continued)

light of a second visible light band, wherein at least a portion of the third element is arranged to overlaps the second element.

15 Claims, 24 Drawing Sheets

(51) Int. Cl.
 *G06K 9/00* (2006.01)
 *H01L 27/32* (2006.01)
(58) Field of Classification Search
 CPC .............. H01L 27/3213; H04M 1/026; H04M 2250/12; H04M 1/0266; G06K 9/0004; G06F 3/0412
 See application file for complete search history.

(56) References Cited

U.S. PATENT DOCUMENTS

| 9,836,165 | B2 | 12/2017 | Nho et al. |
| 2011/0169779 | A1 | 7/2011 | Boer et al. |
| 2012/0120013 | A1 | 5/2012 | Kurz |
| 2015/0015488 | A1 | 1/2015 | Hughes et al. |
| 2015/0331508 | A1 | 11/2015 | Nho et al. |
| 2015/0364107 | A1 | 12/2015 | Sakariya et al. |
| 2016/0181560 | A1 | 6/2016 | Yamamoto et al. |
| 2017/0090246 | A1 | 3/2017 | Seo et al. |
| 2017/0220838 | A1* | 8/2017 | He .......................... G06F 3/044 |
| 2017/0278909 | A1 | 9/2017 | Jeon et al. |
| 2019/0102016 | A1 | 4/2019 | Kim et al. |

FOREIGN PATENT DOCUMENTS

| KR | 1020110095565 | 8/2011 |
| KR | 1020160073906 | 6/2016 |
| KR | 1020170037436 | 4/2017 |
| KR | 1020170105272 | 9/2017 |

OTHER PUBLICATIONS

Chinese Office Action dated Jan. 29, 2021 issued in counterpart application No. 201980007891.4, 21 pages.
PCT/ISA/210 Search Report issued on PCT/KR2019/000899, dated Apr. 26, 2019, pp. 5.
PCT/ISA/237 Written Opinion issued on PCT/KR2019/000899, dated Apr. 26, 2019, pp. 5.

* cited by examiner

DISPLAY HAVING INFRARED ELEMENT ARRANGED SUCH THAT AT LEAST ONE PORTION THEREOF OVERLAPS PIXEL, AND ELECTRONIC DEVICE INCLUDING SAME

CROSS-REFERENCE TO RELATED APPLICATION(S)

This application is a National Phase Entry of PCT International Application No. PCT/KR2019/000899, which was filed on Jan. 22, 2019 and claims priority to Korean Patent Application No. 10-2018-0008359, which was filed on Jan. 23, 2018, the contents of each of which are incorporated herein by reference.

BACKGROUND

1. Field

Various embodiments disclosed in the document relate to a display and, specifically, relate to a display including infrared elements and an electronic device including the same.

2. Description of the Related Art

In general, electronic devices denote devices for executing specific functions according to installed programs, such as electronic organizers, portable multimedia players, mobile communication terminals, tablet PCs, video/audio devices, desktop/laptop computers, vehicle navigation devices, or the like, as well as home appliances. For example, these electronic devices may output stored information as audio or videos. Recently, high integration of electronic devices and proliferation of ultra-high-speed and large-capacity wireless communication have brought about various functions provided in a single mobile communication terminal. For example, entertainment functions such as games, multimedia functions such as music/video playback, communication and security functions for mobile banking and the like, and functions such as scheduling and electronic wallets, as well as communication functions, are being integrated into a single electronic device.

In recent years, security functions required for executing mobile banking, mobile credit cards, electronic wallets, and the like, as well as a function of protecting personal information stored in an electronic device, have been provided to portable electronic devices such as mobile communication terminals. For example, the security functions provided to the electronic devices may include a password or a locking pattern set by a user, user authentication via security companies, and the like. The authentication method using a password or a security company may have a low security level due to a high possibility of a password leak, or dealing with the security company may be cumbersome. As an alternative thereto, a biometric authentication method, such as a user authentication method using fingerprint or iris recognition, may improve the user's convenience while providing a considerable security level.

In particular, the biometric authentication method has advantages in that separate identification objects are not required, there is little risk of theft or imitation, and the user's biometric information remains stable across a lifespan. Therefore, the biometric authentication method is widely applied to various electronic devices including portable electronic devices for user authentication thereof.

SUMMARY

Among the biometric authentication methods, a user authentication method through fingerprint recognition provides a fingerprint authentication function based on a biometric sensor disposed around a lower area of a display included in an electronic device or in the surface of a case of the electronic device.

As an example of the biometric sensor, an optical fingerprint recognition sensor using light may be proposed. The optical fingerprint recognition sensor using light illuminates a user's finger to detect an image corresponding to at least a portion of the user's fingerprint (e.g., ridge portions or valley portions). Among the electronic devices including a display, an electronic device employing an optical fingerprint recognition sensor may be usefully used for access control to a specific place, such as a door lock, and may be configured to be mounted to a miniaturized electronic device such as a mobile communication terminal.

An electronic device using an optical fingerprint recognition sensor recognizes fingerprints, based on light. In the case where a light source emits light having a wavelength in a visible band, a fingerprint shape may be incorrectly recognized depending on the surface state of an external object approaching the electronic device (for example, if a user has a damaged finger, such as scratches or the like, the surface of the damaged finger may cause misrecognition of the fingerprint, or may reduce a recognition rate thereof). In some embodiments, if the recognition of a fingerprint is performed in an external environment in which light having a stronger intensity than the light emitted from the electronic device illuminates (e.g., if the light emitted from the electronic device is saturated with sunlight), the fingerprint recognition rate may be significantly reduced.

Various embodiments disclosed in the document may provide a display supporting an optical fingerprint recognition function and an electronic device including the same, wherein an infrared pixel emitting light in an infrared band is mounted to the display, thereby providing an improved recognition rate.

Various embodiments disclosed in the document may provide a display that emits light in a band, which is not saturated with sunlight, and an electronic device including the same.

In addition, various embodiments disclosed in the document may be configured to have a high resolution while exhibiting an improved fingerprint recognition rate, and thus may be applicable to a small display and an electronic device including the same.

Various embodiments disclosed in the document may provide a display including: a substrate; a first element configured to emit light in a first visible band and a second element configured to emit light in an infrared band, which are formed on the substrate; and a third element configured to emit light in a second visible band, wherein at least a portion of the third element is arranged to overlap the second element.

Various embodiments disclosed in the document may provide an electronic device including: a housing; a display mounted to at least one surface of the housing and configured to emit light in at least one of a visible band or an infrared band; a biometric sensor module configured to obtain image information related to a user's fingerprint using at least a portion of the light emitted from the display; and a processor configured to perform authentication for a fingerprint, based at least in part on image information recognized through the biometric sensor module, wherein the display may include: a substrate; a color pixel formed on the substrate and configured to emit light in a visible band; and an infrared element arranged to overlap at least a portion of the color pixel and configured to emit light in an infrared band.

A display according to various embodiments disclosed in the document and an electronic device including the same may provide a biometric sensor configured to emit light in an infrared band so that the light penetrates the surface of an external object approaching the electronic device to a predetermined depth that light in a visible band cannot reach, and may perform fingerprint recognition using the light reflected therefrom, thereby increasing the precision of recognition.

A display according to various embodiments disclosed in the document and an electronic device including the same may provide a biometric sensor configured to emit light in an infrared band, wherein the infrared band corresponds to the light in a band, which is not saturated with sunlight, thereby reducing a sensing error rate of the biometric sensor even in an external environment exposed to sunlight (ex, in the case where an electronic device is used outdoors during the daytime).

Organic light-emitting diodes (OLEDs) (or organic electroluminescence display devices) may be applied to the displays according to various embodiments disclosed in the document, wherein at least a portion of an infrared element overlaps at least a portion of a color pixel constituting the OLED so that unit pixels in a combination of the infrared element and the color pixel are densely configured in a specific area of the display, thereby providing a display with a high resolution.

DETAILED DESCRIPTION

Figure 1:
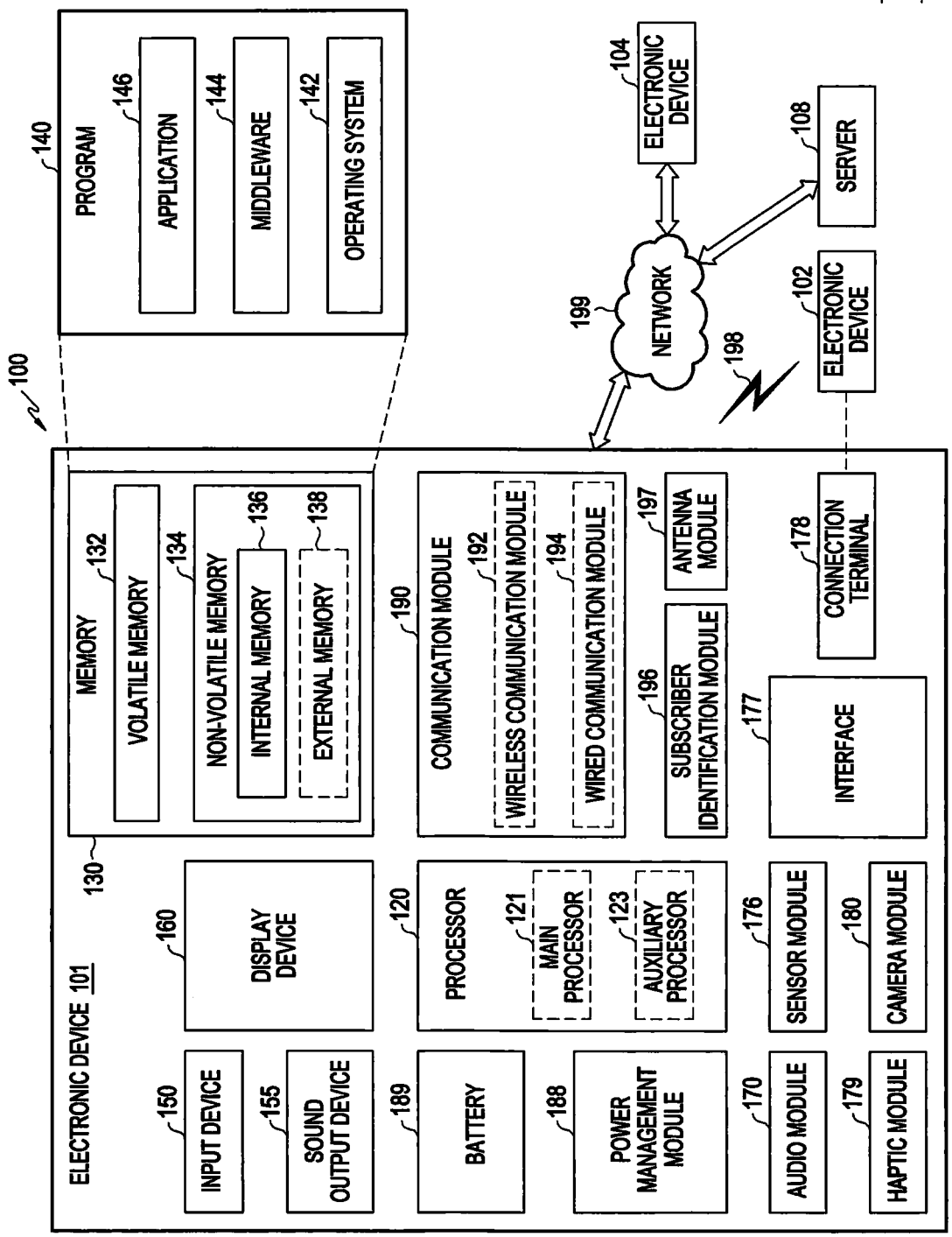
FIG. 1 is a block diagram of an electronic device in a network environment according to various embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134.

According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may he implemented as separate from, or as part of the main processor 121.

The auxiliary processor 123 may control, for example, at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123. The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may he used for general purposes, such as playing multimedia or playing record, and the receiver may be used for incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly or wirelessly. According to an embodiment, the interface 177 may include, for example, a high definition multimedia interface (HMDI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101.

According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 include at least one antenna, and in such a case, at least one antenna appropriate for a communication scheme used in the communication network, such as the first network 198 or the second network 199, may be selected, for example, by the communication module 190 from the plurality of antennas. The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108 For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
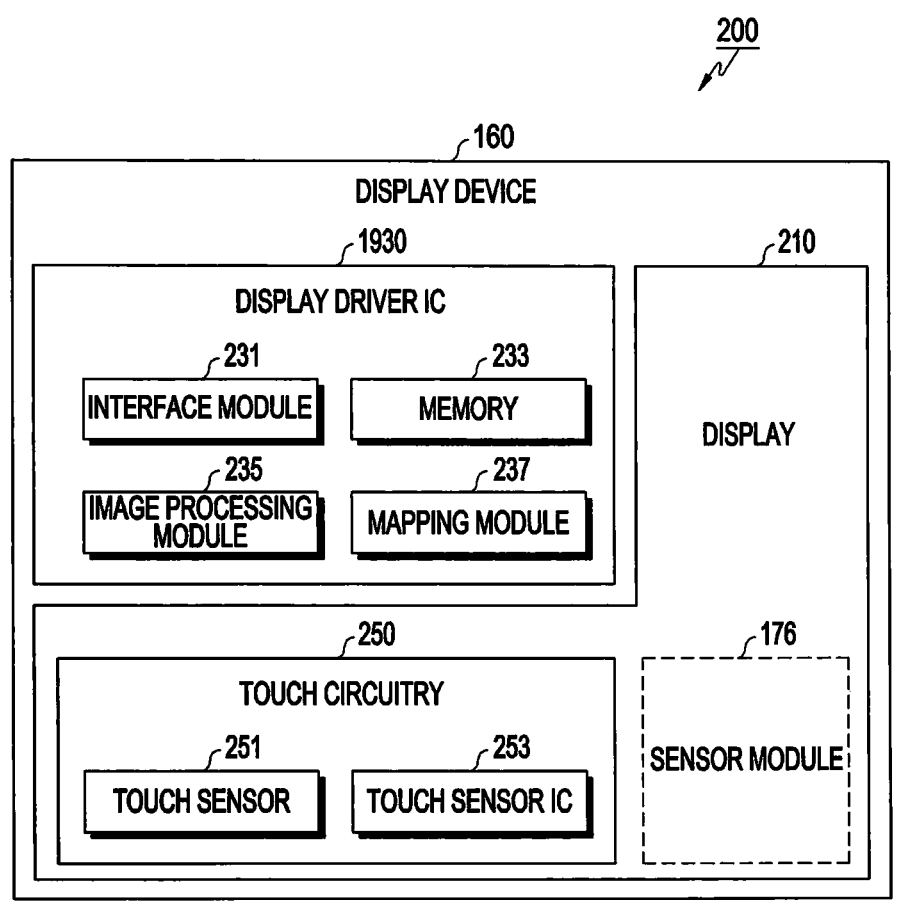
FIG. 2 is a block diagram of a display device (e.g., a display) according to various embodiments.

FIG. 2 is a block diagram 200 illustrating the display device 160 according to various embodiments.

Referring to FIG. 2, the display device 160 may include a display 210 and a display driver integrated circuit (DDI) 230 to control the display 210. The DDI 230 may include an interface module 231, memory 233 (e.g., buffer memory), an image processing module 235, or a mapping module 237. The DDI 230 may receive, for example, image information that contains image data or an image control signal corresponding to a command to control the image data from another component of the electronic device 101 via the interface module 231. For example, according to an embodiment, the image information may be received from the processor 120 (e.g., the main processor 121 (e.g., an application processor)) or the auxiliary processor 123 (e.g., a graphics processing unit) operated independently from the function of the main processor 121. The DDI 230 may communicate with touch circuitry 250 or the sensor module 176 via the interface module 231. The DDI 230 may also store at least part of the received image information in the memory 233, for example, on a frame by frame basis. The image processing module 235 may perform, for example, pre-processing or post-processing (e.g., adjustment of resolution, brightness, or size) with respect to at least part of the image data. The mapping module 237 may generate a voltage value or a current value corresponding to the image data pre-processed or post-processed by the image processing module 135. According to an embodiment, the generating of the voltage value or current value may be performed, for example, based at least in part on one or more attributes of the pixels (e.g., an array, such as an RGB stripe or a pentile structure, of the pixels, or the size of each subpixel). At least some pixels of the display 210 may be driven, for example, based at least in part on the voltage value or the current value such that visual information (e.g., a text, an image, or an icon) corresponding to the image data may be displayed via the display 210.

According to an embodiment, the display device 160 may further include the touch circuitry 250. The touch circuitry 250 may include a touch sensor 151 and a touch sensor IC 153 to control the touch sensor 151. The touch sensor IC 153 may control, for example, the touch sensor 151 to sense a touch input or a hovering input with respect to a certain position on the display 210. To achieve this, for example, the touch sensor IC 153 may measure a change in a signal (e.g., a voltage, a quantity of light, a resistance, or a quantity of electric charges) corresponding to the certain position on the display 210 to detect a touch input or a hovering input. The touch sensor IC 153 may provide input information (e.g., a position, an area, a pressure, or a time) indicative of the detected touch input or the hovering input to the processor 120. According to an embodiment, at least part (e.g., the touch sensor IC 153) of the touch circuitry 250 may be formed as part of the display 210 or the DDI 230, or as part of another component (e.g., the auxiliary processor 123) disposed outside the display device 160.

According to an embodiment, the display device 160 may further include at least one sensor (e.g., a fingerprint sensor, an iris sensor, a pressure sensor, or an illuminance sensor) of the sensor module 176 or a control circuit for the at least one sensor. In such a case, the at least one sensor or the control circuit for the at least one sensor may be embedded in one portion of a component (e.g., the display 210, the DDI 230, or the touch circuitry 250)) of the display device 160. For example, when the sensor module 176 embedded in the display device 160 includes a biometric sensor (e.g., a fingerprint sensor), the biometric sensor may obtain biometric information (e.g., a fingerprint image) corresponding to a touch input received via a portion of the display 210. As another example, when the sensor module 176 embedded in the display device 160 includes a pressure sensor, the pressure sensor may obtain pressure information corresponding to a touch input received via a partial or whole area of the display 210. According to an embodiment, the touch sensor 151 or the sensor module 176 may be disposed between pixels in a pixel layer of the display 210, or over or under the pixel layer.

Figure 3:
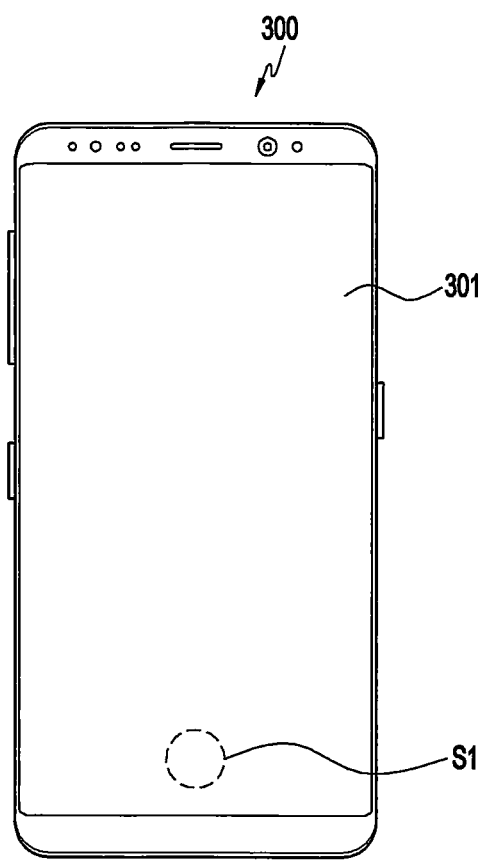
FIG. 3 is a diagram illustrating a front surface of an electronic device according to various embodiments disclosed in the document.
Figure 4:
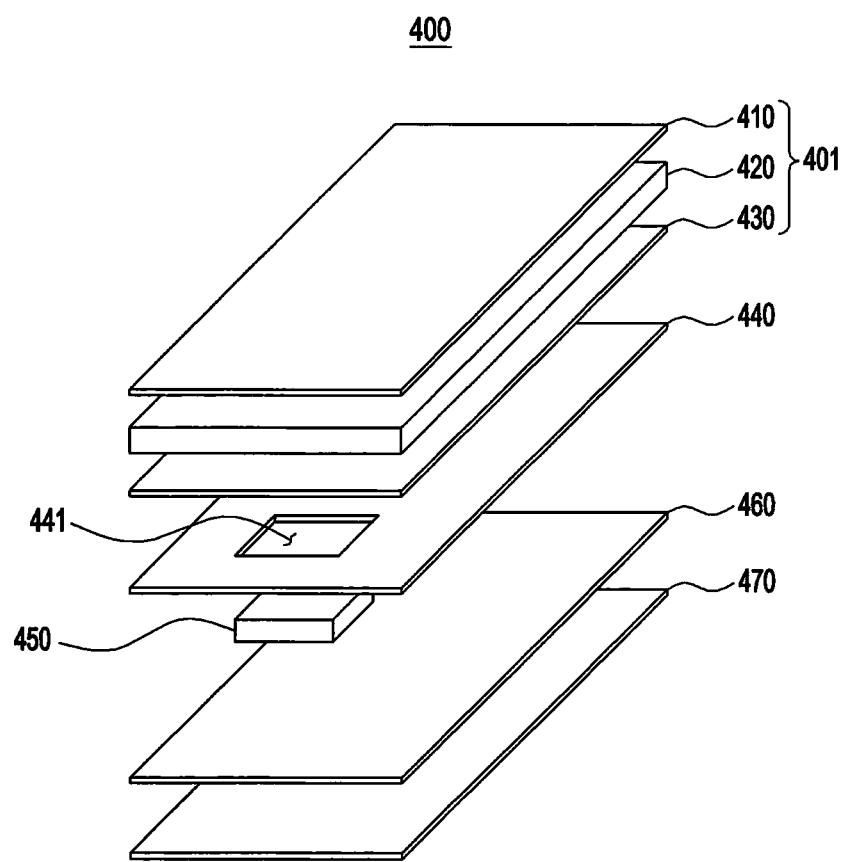
FIG. 4 is an exploded perspective view of an electronic device according to various embodiments disclosed in the document.

FIG. 3 is a diagram illustrating a front surface of an electronic device 300 according to various embodiments disclosed in the document. FIG. 4 is an exploded perspective view of an electronic device 400 according to various embodiments disclosed in the document.

Referring to FIGS. 3 and 4, an electronic device 300 or 400 (e.g., the electronic device 101) according to various embodiments disclosed in the document may include a display 301 or 401 (e.g., the display 210), a rear panel 440, a biometric sensor 450 (e.g., the sensor module 176), a printed circuit substrate 460, and a rear cover 470. According to various embodiments, the electronic device 300 or 400 may further include a battery, and may further include a bracket for fixing the display 301 or 401, the rear panel 440, the biometric sensor 450, the printed circuit substrate 460, and the rear cover 470. The bracket may be provided integrally with a case configured to surround side surfaces of the display 301 or 401, or may be provided independently as a separate configuration from the case.

The display 301 and 401 (e.g., the display 210) may include a plurality of pixels arranged in a matrix form, lines arranged to supply a predetermined power to the plurality of pixels, a display driver integrated-chip (IC) (hereinafter, referred to as a "DDI") for supplying a signal to the lines, and a substrate on which the plurality of pixels, the lines, and the DDI are placed. At least a portion of the display 301 or 401 may be formed to be transparent (or may be formed to have a specified transparency). For example, the areas between the lines of the display 301 or 401 may have a specified transparency to allow light to pass therethrough. The display 301 or 401 may be provided to occupy at least a portion of the front surface of the electronic device 300 or 400 (e.g., the electronic device 101), and may be provided to a portion (e.g., edges) of the side surfaces of the electronic device 300 or 400. The plurality of pixels arranged on the display 301 or 401 may emit a specified light (e.g., visible light and/or infrared light) under the control of a processor (e.g., the processor 120) or the DDI (e.g., the DDI 230). The light emitted from the pixel passes through the display 301 or 401 and is reflected by an external object (e.g., a finger) placed in front of the display 301 or 401, and the reflected light passes back through the display 301 or 401, thereby reaching the biometric sensor 450 for sensing fingerprints, arranged inside the electronic device 300 or 400.

The display 301 or 401 according to various embodiments (e.g., the display 210) may include an outer protective layer 410, an intermediate layer 420, and a display panel 430. Here, the outer protective layer 410 (e.g., cover glass) may include a material of glass or polymer, and may be made of a transparent material. In addition, the intermediate layer 420 may include a polarizing layer (POL) and the like, and may further include an optically transparent adhesive layer {e.g., an optical clear adhesive (OCA)} for bonding the outer protective layer 410 and the polarizing layer (POL) according to an embodiment. The display panel 430 {e.g., an organic light-emitting diode (OLED)} may include a plurality of pixels, and the plurality of pixels may form at least one layer. According to various embodiments, the display panel 430 may be an on-chip touch AMOLED (OCTA) panel, and may further include a touch sensor capable of identifying whether or not a touch is performed by measuring the pressure of an external object. The display panel 430 according to various embodiments disclosed in the document will be described in detail below.

The biometric sensor 450 (e.g., the sensor module 176) may be arranged to face a specific area of the display 301 or 401. Based on this, the biometric sensor 450 may perform fingerprint sensing on the finger through the specific area of the display 301 or 401. The biometric sensor 450 according to various embodiments disclosed in the document may be arranged on the rear surface of the display 301 or 401 in which at least a portion thereof is transparent, thereby collecting the light passing through the display 301 or 401.

The biometric sensor 450 according to various embodiments disclosed in the document may be arranged to pass through at least a portion of the rear panel 440 through a sensor arrangement area 441 (e.g., an opening) formed in the rear panel 440 so as to face a specific area of the display 301 or 401. For example, the sensor arrangement area 441 may be formed in the shape of a hole passing through the front and rear surfaces of the rear panel 440. The shape and location of the hole are not limited. According to an embodiment, the sensor arrangement area 441 may be formed on the lower or upper surface of the rear panel 440, and may be arranged at various positions such as the edges of the rear panel 440.

At least some configurations of the biometric sensor 450 according to an embodiment may be mounted on the same layer as the pixels provided in the display 301 or 401, instead of being mounted to the rear surface of the display 301 or 401. According to various embodiments, the biometric sensor 450 may be arranged in at least a portion of the display 301 or 401 as shown in FIG. 3. For example, the biometric sensor 450 may be arranged in a portion including a fingerprint verification area S1 included in the display 301 or 401.

According to various embodiments disclosed in the document, light may be emitted from the display 301 or 401 (e.g., the display 210), and the biometric sensor 450 (e.g., the sensor module 176) may collect at least a portion of the light reflected by an external object (e.g., a user's finger). Therefore, the biometric sensor 450 may include a light receiver capable of collecting the light reflected from the object. If light is collected by the light receiver, the biometric sensor 450 may generate image information corresponding to the collected light, and the generated image information may be stored to be used by a processor (e.g., the processor 120) and/or a memory (e.g., the memory 130). According to various embodiments, the biometric sensor 450 may transmit, to the DDI, an event for obtaining image information (e.g., information indicating whether or not image information is obtained). According to an embodiment, the electronic device 300 or 400 may further include a signal line capable of transmitting the event between the biometric sensor 450 and the DDI. The processor (e.g., the processor 120) may compare the generated image information with a previously stored image, thereby performing user authentication.

According to various embodiments, the rear panel 440 may be arranged on the rear surface of the display 301 or 401 (e.g., the display 210) to protect the display 301 or 401 from impact or to support the display 301 or 401 on the housing (e.g., a bracket). According to an embodiment, heat generated in the display 301 or 401 may be dissipated. For example, the rear panel 440 may include a protective layer (or a support layer) or a heat dissipation layer at least a portion of which is formed of a metal material. The protective layer may be configured as, for example, a cushion or embossment for absorbing impact, or may be configured as a light blocking member for blocking light (e.g., a black sheet or a black printed layer), and the protective layer may be formed by integrating the above components or stacking a plurality of layers formed for each component.

According to various embodiments, the rear panel 440 may include an electromagnetic induction panel (e.g., a digitizer). The electromagnetic induction panel may detect the approach of an electromagnetic induction object such as a stylus or the like. The electromagnetic induction panel may be arranged between the protective layer and the heat dissipation layer. The rear panel 440 according to various embodiments disclosed in the document may include a sensor arrangement area 441 in the form of a hole into which the biometric sensor 450 (e.g., the sensor module 176) is inserted or that is aligned vertically with at least a portion of the biometric sensor 450. The sensor arrangement area 441 may include a hole having a predetermined size corresponding to the size of the biometric sensor 450, which is formed to pass through the front and rear surfaces of the rear panel 440. According to various embodiments, one or more hardware components (e.g., a camera module, a microphone, a speaker, a USB interface, and the like) of the electronic device 300 or 400 (e.g., the display device 160) may be arranged on the printed circuit substrate 460. According to an embodiment, an image signal processor may be arranged on the printed circuit substrate 210 to perform processing in relation to fingerprint authentication. In addition, the printed circuit substrate 460 may include lines that have at least one contact terminal electrically connected to a battery and transmit power provided from the battery to the display 301 or 401 and/or the biometric sensor 450.

The battery may be arranged under the rear panel 440 and/or in a layer parallel to the printed circuit substrate 460. The battery may supply power to the printed circuit substrate 460 electrically connected thereto, and may supply power to specified components (e.g., the display 301 or 401, the biometric sensor 450, and the like) in response to processor control of the printed circuit substrate 460.

The rear cover 470 may be arranged under the printed circuit substrate 460 and the battery so as to cover at least a portion of the printed circuit substrate 460 and the battery. The rear cover 470 may be formed of any of various materials (for example, plastic, metal, or glass). The rear cover 470 may be fixed to the above-described case or bracket.

Figure 5:
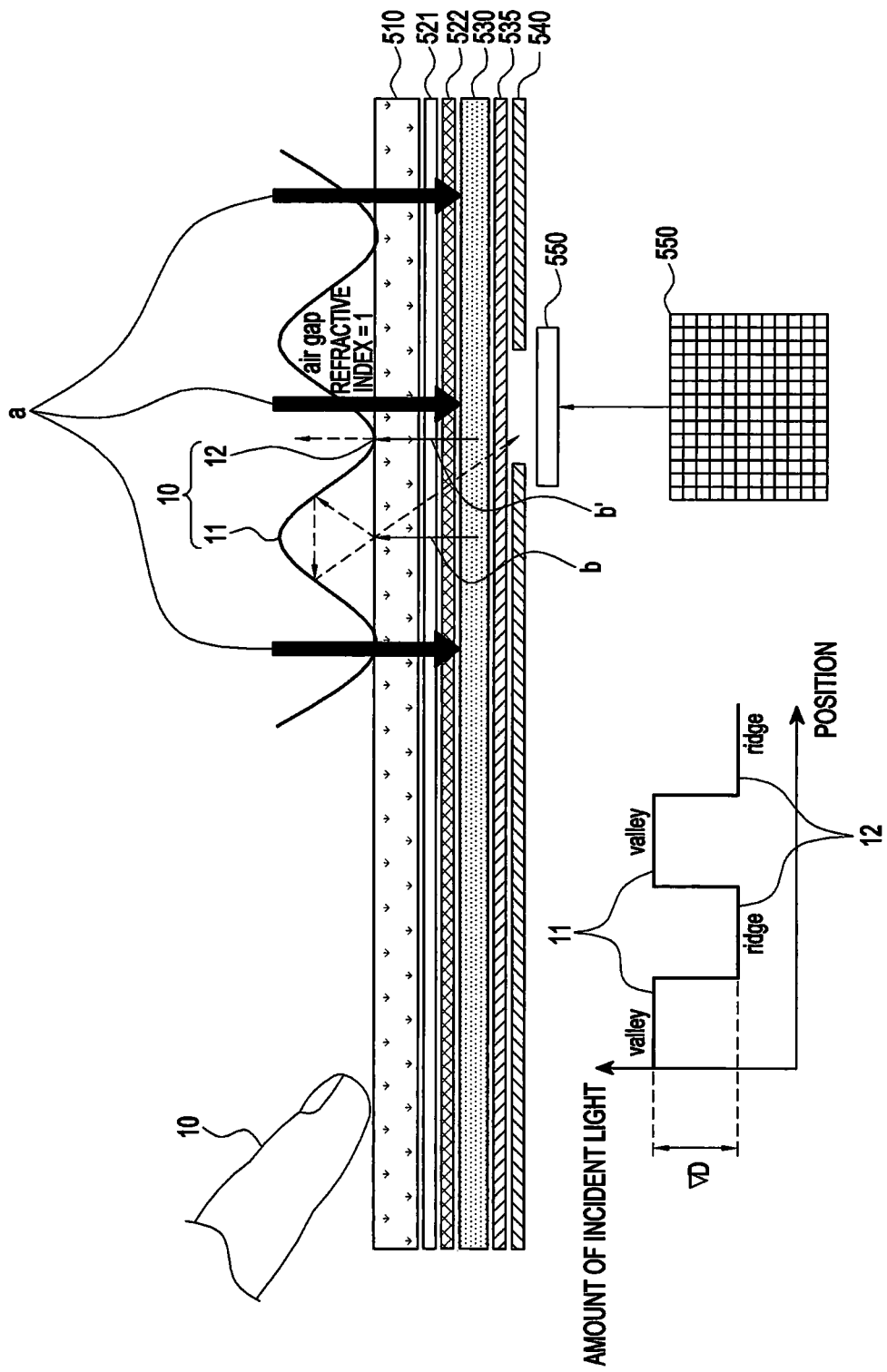
FIG. 5 is a cross-sectional side view illustrating the state in which the light emitted from an electronic device is refracted according to various embodiments disclosed in the document.

The principle of recognizing a fingerprint in an electronic device (e.g., the electronic device 101) according to an embodiment may be described with reference to FIG. 5. FIG. 5 is a cross-sectional side view illustrating the state in which the light emitted from an electronic device is refracted according to an embodiment.

An electronic device (e.g., the electronic device 101) according to various embodiments may include cover glass 510, an adhesive layer 521, a polarizing layer 522, a display panel 530, a selective transmission layer 535, a rear panel 540, and at least one biometric sensor 550 (e.g., the biometric sensor 450). The biometric sensor 550 may be arranged on substantially the same plane as the display panel 530, or may be arranged under the rear panel 540. The biometric sensor 550 may receive the light, which is emitted from the display panel 530 and reflected from an external object toward the display panel, thereby obtaining image information. For example, FIG. 5 shows the biometric sensor 550 arranged under the rear panel 540. The selective transmission layer 535 may be configured to be interposed between the display panel 530 and the rear panel 540, and may be configured to selectively transmit light such that the biometric sensor 550 may receive only the light in a specific band, among the light incident thereon.

As illustrated in FIG. 5, when the light emitted from the display panel 530 reaches the surface of a user's finger, almost all of the light reaching a ridge portion 12 that is in close contact with the cover glass 510 may be absorbed because the refractive index of the cover glass 510 is similar to that of the skin in ridge portion 12. On the other hand, a valley portion 11 has an air gap because the valley portion 11 is not in close contact with the cover glass 510. Since the light passing through the air gap reaches a portion of the inclined valley portion 11, the degree of refraction of the light passing through the cover glass 510 and reaching the valley portion 11 may be relatively greater than that of the ridge portion 12. Accordingly, the light may be refracted and reflected, and the reflected light may return to the interior of the electronic device including the cover glass 510, and may be received by the biometric sensor 550. In this process, if the shapes of the valley portion 11 and the ridge portion 12 of the finger are different between users or depending on the environment even in the case of the same user, the difference (ΔD) in the amount of incident light may differ, and the image information obtained from the biometric sensor 550 may be recognized to be different based on the difference (ΔD) in the amount of incident light. If the shapes of the valley portion and the ridge portion of the fingerprint of a user are correctly recognized, specific image information may be obtained by accurately detecting the difference (ΔD) in the amount of incident light, which may be utilized for user authentication by recognizing a specific user corresponding to the specific image information. For reference, the biometric sensor 550 may be configured as light reception elements, such as photodiodes, arranged in a matrix form.

FIG. 5 described above is intended to explain an example of a principle in which a fingerprint is recognized in an electronic device (e.g., the electronic device 101) including a display (e.g., the display 210) and a biometric sensor 550, and the disclosure is not limited thereto. According to various embodiments, the biometric sensor 550 (e.g., the sensor module 176) may be arranged in substantially the same layer as the display panel 530, may be arranged under the display panel 530, or may be embedded in the substrate (e.g., 470 in FIG. 4) while being arranged under the display panel 530.

According to various embodiments disclosed in the document, if the light emitted from the display panel 530 reaches the user's finger 10, the difference (ΔD) in the amount of light incident on the biometric sensor 550 may differ depending on the state of the finger. According to an embodiment, if the light emitted from the display panel 530 is visible light having low transmittance, the light may penetrate into the outer skin of the finger, but may not penetrate into the inner skin thereof. If the light fails to penetrate into the inner skin of the finger, the probability of accurately recognizing the shape of the fingerprint extending from the outer skin to the inner skin may be reduced. For example, if the user's finger is scratched, if the fingertip is wet, or if an external environment is harsh (for example, when the outside temperature is very high or in cold weather), the fingerprint may be recognized only by the shape of the outer skin of the finger, which may increase the probability of erroneous recognition and make it difficult to authenticate a user.

According to various embodiments disclosed in the document, the display panel 530 may emit infrared light, instead of visible light. Since the light in an infrared band, emitted from the display panel 530, has a long wavelength and higher transmittance than that of visible light, the light may penetrate into the inner skin of the finger, as well as the outer skin thereof, thereby accurately recognizing the ridge portion 12 and valley portion 11 of the finger.

Figure 6:
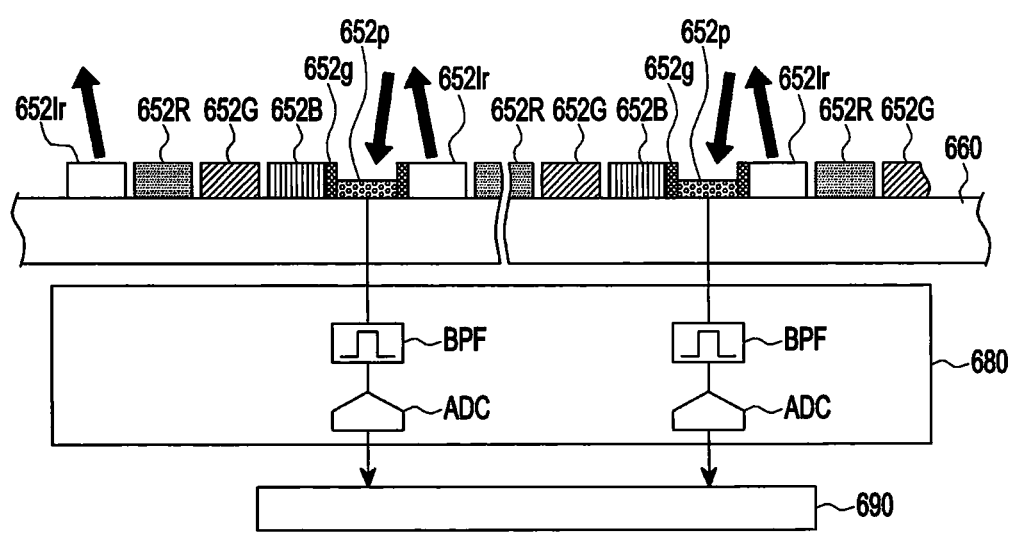
FIG. 6 is a diagram illustrating a structure in which a plurality of pixels emitting light in a visible band and an element emitting light in an infrared band are arranged on the same OLED layer in an electronic device according to various embodiments disclosed in the document.

FIG. 6 is a diagram illustrating the structure in which a plurality of pixels emitting light in a visible band and elements emitting light in an infrared band are arranged in substantially the same OLED layer in an electronic device (e.g., the electronic device 101) according to various embodiments disclosed in the document.

A display panel (e.g., the display panel 530) according to various embodiments disclosed in the document may include a plurality of pixels.

In various embodiments disclosed in the document, the pixel, which is a picture element, may be a minimum unit (unit pixel) constituting an image, but is not limited thereto. According to various embodiments, the pixel included in the display panel (e.g., the display panel 530) may include an element that emits light in a visible band (hereinafter, referred to as a "color pixel") or an element that emits light in an infrared band (hereinafter, referred to as an "infrared element"). According to various embodiments, the color pixel may be one point that is a minimum unit constituting an image. The color pixel may also be configured to include a plurality of subpixels. For example, as shown in FIG. 6, the color pixel may include various color subpixels (e.g., a red-light subpixel 652R, a green-light subpixel 652G, and a blue-light subpixel 652B) provided to emit various colors. The color subpixels (e.g., the red-light subpixel 652R, the green-light subpixel 652G, and the blue-light subpixel 652B) may be arranged on substantially the same plane to form a layer. An infrared element 652Ir according to an embodiment may be arranged on substantially the same plane as the color subpixels as shown in the cross-sectional view of FIG. 6. The display panel (e.g., the display panel 530) according to various embodiments disclosed in the document may include a light receiver 652p for receiving the light emitted from the infrared element 652Ir, wherein the light receiver 652p may also be arranged on substantially the same plane as the color subpixels. in the case where the light receiver 652p is provided, a guide wall 652g for guiding the incident light may be further provided.

The electronic device (e.g., the electronic device 101) according to various embodiments disclosed in the document may further include a biometric sensor 680 in addition to the display panel (e.g., the display panel 530). The biometric sensor 680 may be configured to include the light receiver 652P provided for sensing a fingerprint, and may further include a band pass filter and an analog-to-digital converter according to various embodiments. According to various embodiments disclosed in the document, an image processor 690 may be further included. The light receiver 652p included in the biometric sensor 680 may be arranged on substantially the same plane as the color pixels of the display, as shown in FIG. 6, or may be arranged under the display. Here, the light receiver being arranged under the display may include the light receiver being embedded in the substrate 660 constituting the display panel. According to various embodiments, the biometric sensor 680 may be configured as a module (e.g., the sensor module 176). In the case where the biometric sensor is configured as a module, each component included in the module may transmit obtained image information through a signal line. The image processor 690 may include user authentication logic that compares image information transmitted from the biometric sensor 680 with preset user information.

According to various embodiments disclosed in the document, the infrared element 652Ir and the light receiver 652p may be arranged adjacent to each other. In order to minimize a travel path of the infrared light emitted from the infrared pixel 652Ir and reflected by an external object to thus return to the light receiver 652p, the infrared element 652Ir and the light receiver 652p may be arranged adjacent to each other. The display (e.g., the display 210) according to various embodiments disclosed in the document may include a plurality of pixels, and each pixel may include an organic light-emitting diode (OLED) and a pixel circuit for controlling the organic light-emitting diode (OLED). The pixel circuit may include a switching transistor (switching TFT), a driving transistor (driving TFT), and a storage capacitor.

In the case where the display (e.g., the display 210) according to an embodiment disclosed in the document includes the pixel circuit and further includes the infrared element, the light having a wavelength in an infrared band, emitted from the infrared element, may affect the driving transistor (driving TFT) of the organic light-emitting diode (OLED), thereby causing a white spot phenomenon in which white spots spread over the display, regardless of whether the display is in an on (active) state or an off (sleep) state.

In the case where the pixel circuit is made of a silicon-based material, the wavelength of light in an infrared band may affect the silicon-based driving circuits, which may cause the white spot phenomenon. Accordingly, the display according to various embodiments disclosed in the document may prevent the white spot phenomenon by setting the wavelength of light in an infrared band, emitted from the infrared element, to about 1200 nm or more.

Figure 7A:
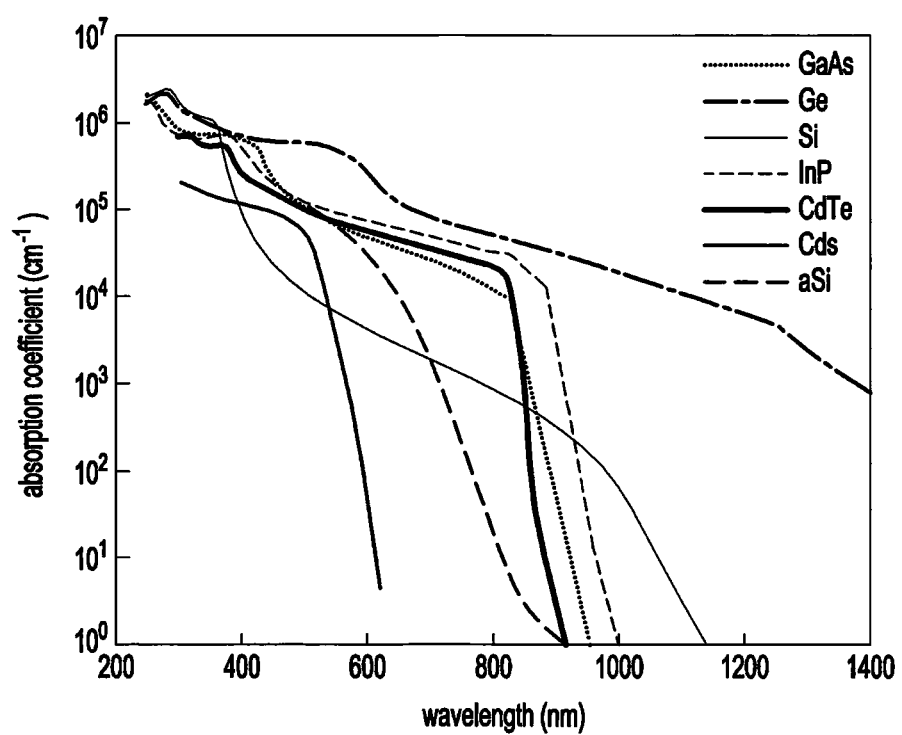
FIG. 7A is a graph showing an absorption coefficient of a semiconductor material applicable to an electronic device depending on a change in the wavelength under a specific temperature condition according to various embodiments disclosed in the document.
Figure 7B:
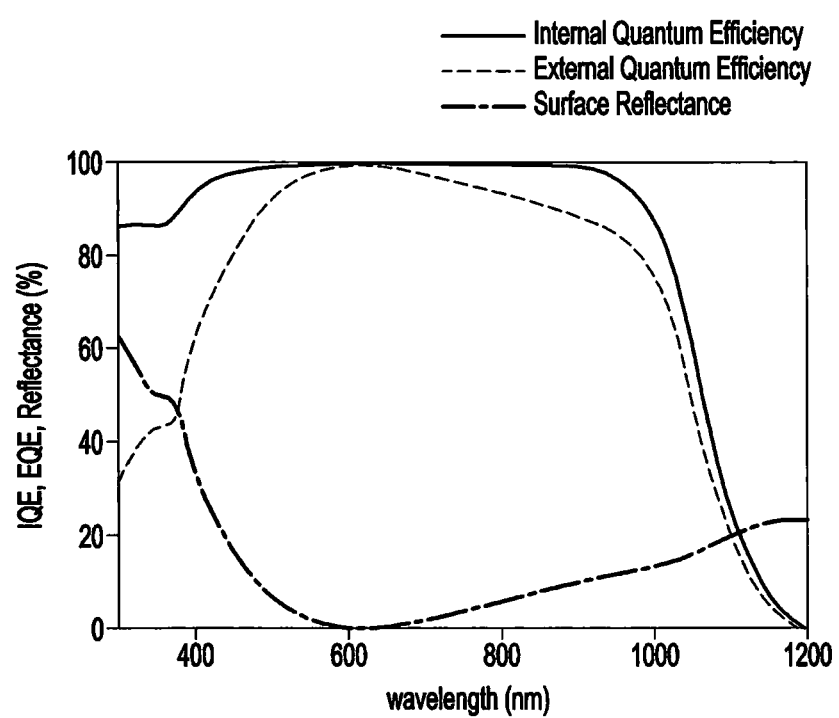
FIG. 7B is a graph showing quantum efficiency of a semiconductor material applicable to an electronic device depending on a change in the wavelength under a specific temperature condition according to various embodiments disclosed in the document.

FIG. 7A is a graph showing an absorption coefficient of a semiconductor material applicable to an electronic device (e.g., the electronic device 101) depending on a change in the wavelength according to various embodiments disclosed in the document. FIG. 7B is a graph showing quantum efficiency of a semiconductor material applicable to an electronic device (e.g., the electronic device 101) depending on a change in the wavelength according to various embodiments disclosed in the document. The graphs shown in FIGS. 7A and 7B may show measurement results under a specific temperature condition.

Referring to FIGS. 7A and 7B, it can be seen that the absorption coefficient of a silicon-based material widely used in driving circuits approximates to zero for a wavelength in a band of about 1200 nm or more, and that the quantum efficiency thereof is significantly reduced for a wavelength of about 1200 nm or more. Therefore, it may be estimated that emitting infrared light having a wavelength in a band of about 1200 nm or more may not affect the light emission of any material.

Figure 8:
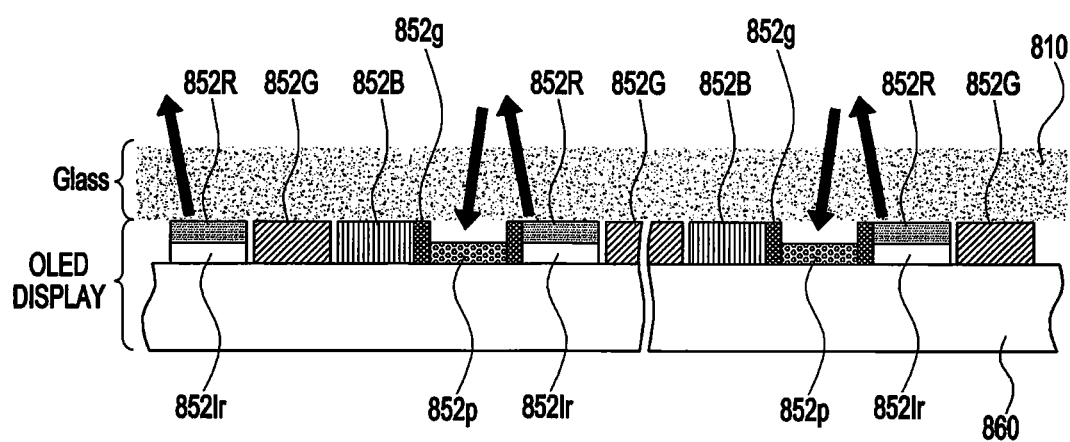
FIG. 8 is a diagram illustrating an OLED structure in which an element emitting light in an infrared band is arranged under one of a plurality of pixels emitting light in a visible band in a display according to an embodiment disclosed in the document.

FIG. 8 is a diagram illustrating an OLED layer in which an element emitting light in an infrared band is arranged under one of a plurality of pixels emitting light in a visible band in a display (e.g., the display 210) according to an embodiment disclosed in the document.

A display panel (e.g., the display panel 430) according to various embodiments disclosed in the document may include color pixels and infrared elements. According to various embodiments, the color pixel may be configured as a combination of a plurality of color subpixels 852R, 852G, and 852B. Here, the color subpixel may be one of a red-light subpixel 852R, a green-light subpixel 852G, or a blue-light subpixel 852B. The color subpixel may be configured as an organic light-emitting element, and each light-emitting element 852R, 852G, or 852B may be formed in a structure in which a hole transport layer, an organic emission layer, and an electron transport layer are stacked, and may further include a hole injection layer and an electron injection layer.

Referring to the cross-sectional view in FIG. 8, an infrared element 852Ir according to an embodiment may be arranged under the color pixel. Based on the infrared element 852Ir, a color pixel may be arranged on the infrared element 852Ir. According to an embodiment, the infrared element 852Ir may be arranged under the red-light subpixel 852R as shown in FIG. 8 above. However, the disclosure is not limited thereto, and the infrared element may be arranged under the green-light subpixel 852G or the blue-light subpixel 852B. Like the color pixel, the infrared element 852Ir according to an embodiment may also be formed in a structure in which a hole transport layer, an organic emission layer, and an electron transport layer are stacked, and may further include a hole injection layer and an electron injection layer. Since the infrared element 852Ir is arranged under the color pixel, the light emitted from the infrared element 852Ir may pass through at least a portion of the color pixel positioned on the infrared element 852Ir to thus travel to the outside of the display.

According to various embodiments disclosed in the document, at least a portion of the color pixel and the infrared element 852Ir may have a stacked structure. The light having a wavelength in an infrared band, emitted from the infrared element 852Ir, may pass through an organic material, and may not be greatly affected by visible light that reduces the intensity of light or refracts the light to thus disturb the light travelling straight. On the other hand, light having a wavelength in a visible band may have a high energy loss in the process of passing through an organic material, and the intensity of light may be reduced, or the original color of the emitted light may change in the process of illuminating the outside depending on the type of the organic material through which the light passes.

According to various embodiments, the infrared element 852Ir may be arranged under two or more color subpixels among the plurality of color subpixels 852R, 852G, and 852B.

In the case where the infrared element 852Ir is arranged under at least a portion of the color pixel, the stacked structure of at least a portion of the color pixel and the infrared element 852Ir may have substantially the same surface as the color pixel that does not constitute a stacked structure with the infrared element 852Ir. Here, respective components having substantially the same surface may denote the respective components having substantially the same height when the components are arranged on the same plane.

According to an embodiment, in the case where the infrared pixel 852Ir is arranged under at least a portion of the red-light subpixel 852R, a stacked structure including the red-light subpixel 852R and the infrared pixel 852Ir may be formed to have substantially the same height as a single green-light subpixel 852G and a single blue-light subpixel 852B.

According to various embodiments, the single green-light subpixel 852G and the single blue-light subpixel 852B of the display may be intentionally formed to be higher, or the red-light subpixel 852R may be formed to have a height less than the heights of the single green-light subpixel 852G and the single blue-light subpixel 852B. As a result, a portion configured as a stacked structure (e.g., a combination structure of a portion of the color pixel and the infrared element) and a portion, which is not configured as a stacked structure (e.g., the color pixel that does not constitute a stacked structure with the infrared element), may be formed to have substantially the same height. According to another embodiment, since there is a slight difference in height between the pixel constituting a stacked structure and the pixel not configured as a stacked structure, which is not distinguishable to the naked eye, unevenness may be intentionally formed.

According to various embodiments disclosed in the document, in the case where the infrared element 852Ir is arranged under at least a portion of the color pixel, since the wavelength in an infrared band, emitted from the infrared element 852Ir, may affect the driving thin film transistor (TFT), as well as the color pixel, the white spot phenomenon mentioned above may be more serious. In various embodiments disclosed in the document for preventing the above phenomenon, the wavelength emitted from the infrared element 852Ir may be set to a band that does not affect the color pixel. For example, if the light emitted from the infrared element 852Ir has a wavelength band of about 1200 nm or more, the influence on the driving thin film transistor (TFT) may be minimized, and the white spot phenomenon may be prevented.

In the above embodiments, the fundamental concept of arrangement of the infrared element 852Ir under at least a portion of the color pixel has been described. Hereinafter, the stacked structure of the color pixels 852R, 852G, and 852B and the infrared pixel 852Ir may be described in more detail with reference to FIGS. 9 and 10. In the following embodiments, the meaning of "at least a portion" may be noted.

Figure 9:
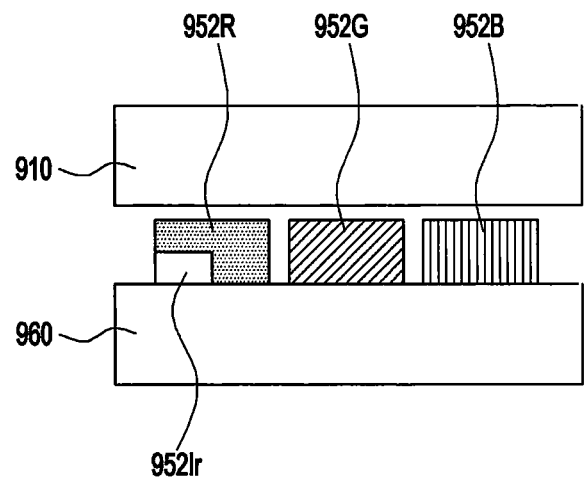
FIG. 9 is a diagram illustrating an OLED structure in which an element emitting light in an infrared band is arranged under at least some of a plurality of pixels emitting light in a visible band in a display according to another embodiment disclosed in the document.
Figure 10:
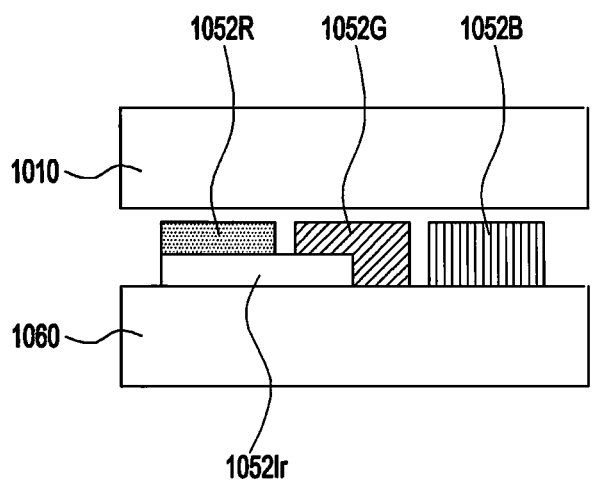
FIG. 10 is a diagram illustrating an OLED structure in which an element emitting light in an infrared band is arranged under at least some of a plurality of pixels emitting light in a visible band in a display according to still another embodiment disclosed in the document.

FIG. 9 is a diagram illustrating an OLED layer in which an infrared element emitting light in an infrared band is arranged under at least some of a plurality of color pixels emitting light in a visible band in a display (e.g., the display 210) according to various embodiments disclosed in the document. FIG. 10 is a diagram illustrating an OLED layer in which an infrared element emitting light in an infrared band is arranged under at least some of a plurality of color pixels emitting light in a visible band in a display (e.g., the display 210) according to another embodiment disclosed in the document.

FIGS. 9 and 10 may illustrate the state in which an element emitting light in an infrared band is arranged under at least some of a plurality of color subpixels emitting light in a visible band. FIG. 9 schematically illustrates some of the configuration of a display according to various embodiments disclosed in the document, and shows cover glass 910, a plurality of color subpixels 952R, 952G, and 952B, an infrared element 952Ir, and a substrate 960. FIG. 10 schematically illustrates some of the configuration of the display according to various embodiments disclosed in the document, and shows cover glass 1010, a plurality of color subpixels 1052R, 1052G, and 1052B, an infrared element 1052Ir, and a substrate 1060.

Hereinafter, a description will be made based on the arrangement of the infrared elements 952Ir and 1052Ir under red-light subpixels 952R and 1052R with reference to FIGS. 9 and 10. However, it should be noted that these are only examples of various embodiments and are not intended to limit the scope of the disclosure. For example, the infrared elements 952Ir and 1052Ir may be arranged under green-light subpixels 952G and 1052G or blue-light subpixels 952B and 1052B.

Referring to FIG. 9, an infrared element 952Ir according to various embodiments disclosed in the document may be arranged under at least a portion of a red-light subpixel 952R. The infrared element 952Ir may be formed to face the entire lower surface of the red-light subpixel 952R, or may be formed to face only a portion of the lower surface of the red-light subpixel 952R.

According to an embodiment, in the case where the infrared element is formed to face only a portion of the lower surface of the red-light subpixel 952R, as shown in FIG. 9, the infrared element 952Ir may be arranged on the same interfacial surface as other portions of the red-light subpixel 952R.

Referring to FIG. 10, the infrared element 1052Ir according to various embodiments disclosed in the document may be arranged under at least a portion of a green-light subpixel 1052G (or another red-light subpixel or a blue-light subpixel 1052B) in addition to a red-light subpixel 1052R. Specifically, the infrared element 1052Ir may be formed to face the entire lower surface of the green-light subpixel 1052G, or may be formed to face only a portion of the lower surface of the green-light subpixel 1052G as shown in the drawing. Alternatively, the infrared element may also be formed to face only a portion of the lower surface of the red-light subpixel 1052R.

In the case where the infrared element 1052Ir is formed to face only a portion of the lower surface of the red-light subpixel 1052R or green-light subpixel 1052G according to the embodiment, the infrared element 1052Ir may be provided on the same interfacial surface as other portions of the red-light subpixel 1052R or green-light subpixel 1052G.

Although several forms of the stacked structure of the color pixels and the infrared elements have been described in the above embodiments, it should be noted that these are only some of various embodiments.

Hereinafter, other embodiments of the display (e.g., the display 210) may be described. According to various embodiments disclosed in the document, one of a plurality of color subpixels may be referred to as a first element, and another thereof may be referred to as a third element. For example, any one of a red-light subpixel R, a green-light subpixel G, and a blue-light subpixel B may be referred to as a first element, and another subpixel other than first element, among the red-light subpixel R, the green-light subpixel G, and the blue-light subpixel B, may be referred to as a third element. The first element and the third element may emit light in a first visible band and light in a second visible band, respectively, and the light in the first visible band and the light in the second visible band may be set to have wavelengths in different bands.

According to an embodiment, an element that emits infrared light (hereinafter, referred to as an "infrared element") may be referred to as a second element.

Referring to FIGS. 9 and 10, the display (e.g., the display 210) according to another embodiment disclosed in the document may include: a substrate 960; a first element for emitting light in a first visible band and a second element for emitting light in an infrared band, which are formed on the substrate 960; and a third element for emitting light in a second visible band, wherein the third element may be arranged on the second element such that at least a portion thereof overlaps the second element.

According to various embodiments, a fourth element for emitting light in an infrared band may be included, and the first element may be arranged on the fourth element such that at least a portion thereof overlaps the fourth element.

According to various embodiments disclosed in the document, the first element or the third element may be a minimum unit pixel constituting an image, or may be a subpixel that is a sub-configuration of the minimum unit pixel constituting an image. That is, the first element and the third element may be optical elements. According to various embodiments, the second element or the fourth element may also be a minimum unit pixel constituting an image, or may not be a minimum unit pixel constituting an image.

According to various embodiments disclosed in the document, the first element may be included in color pixels (e.g., a red-light subpixel, a green-light subpixel, and a blue-light subpixel) for emitting light in a visible band. In addition, according to an embodiment, the third element may also be included in the color pixels (e.g., the red-light subpixel, the green-light subpixel, and the blue-light subpixel), which is a different element from the first element. Here, the fact that the first element and the third element are different elements from each other may mean that the elements are functionally configured to emit light in different colors, but is not limited thereto. For example, the first element and the third element may emit light in the same color while being physically separated from each other. According to another embodiment, the first element and the third element may be substantially the same pixel.

According to various embodiments, the second element may correspond to an infrared element Ir. The fourth element may also correspond to an infrared element Ir, which may be substantially the same as the second element, or may be distinct from the second element. For example, the fourth element may be formed integrally with the second element into the same infrared element Ir, or may be formed, as an independent infrared element Ir, to be separate from the second element.

Here, the fact that the second element and the fourth element are different elements from each other may mean that the elements are configured to perform different functions, but is not limited thereto. For example, the second element and the fourth element may perform the same function while being physically separated from each other. According to an embodiment, the second element and the fourth element may be substantially the same element. According to another example, the second element and the fourth element may emit light having infrared wavelengths in different bands.

The structure of the color pixel and the infrared element according to various embodiments disclosed in the document has been described with reference to FIGS. 6 to 10 above. According to various embodiments, the color pixel and the infrared element may be positioned in the same layer as shown in FIG. 6, or the infrared element may be arranged under at least a portion of the color pixel in the display shown in FIG. 8. Since the display in FIG. 8 provides a condition capable of performing a light-emitting operation using the color pixel and the infrared element in a smaller area than the display in FIG. 6, it is advantageous to increase the resolution of the display and to further apply the same to small electronic devices such as smartphones.

Figure 11:
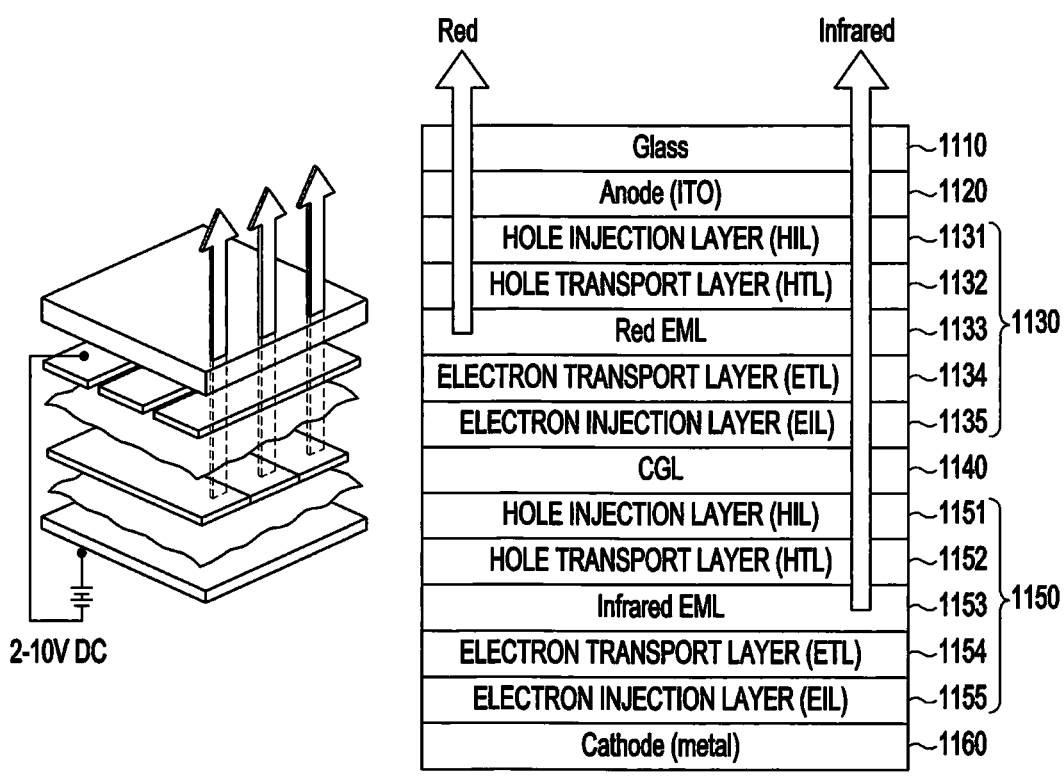
FIG. 11 is a diagram illustrating an OLED layer in which an element emitting light in an infrared band is arranged under a pixel emitting light in a visible band in a display according to various embodiments disclosed in the document.

FIG. 11 is a diagram illustrating an OLED layer in which an element emitting light in an infrared. band is arranged under a pixel emitting light in a visible band in a display (e.g., the display 210) according to various embodiments disclosed in the document. FIG. 11 specifically illustrates an organic light-emitting structure of an element according to various embodiments disclosed in the document.

The display according to various embodiments disclosed in the document may be configured to include cover glass 1110, an anode layer 1120 (e.g., an ITO), a cathode layer 1160 (e.g., metal), and an emission layer. In addition, the emission layer may be formed in a structure in which a hole injection layer (HIL), a hole transport layer (HTL), an organic emission layer (EML), an electron transport layer (ETL), and an electron injection layer (EIL) are stacked. Holes injected. from the anode layer 1120 and electrons injected from the cathode layer 1160 are transferred through the transport paths (HTL and ETL), and are then combined in the organic emission layer (EML) to generate excitons so that light having a specific wavelength is emitted in the organic emission layer (EML) by energy from the generated excitons. Although FIG. 11 shows the red-light organic emission layer (RED EML), the green-light emission layer and the blue-light emission layer may be formed in the same structure.

According to various embodiments disclosed in the document, as shown in FIG. 11, the infrared element 1150 may also be formed in the organic light-emitting structure similar to the organic light-emitting structure of the red-light sub-pixel. The organic light-emitting structure of the infrared element 1150 may also include a hole injection layer (HIL), a hole transport layer (HTL), an electron transport layer (ETL), and an electron injection layer (EIL). According to various embodiments disclosed in the document, the infrared element 1150 may be arranged under the color pixel 1130 so as to share one anode layer 1110 and one cathode layer 1160. In this case, a charge generation layer (CGL) 1140 may be further arranged between the infrared element 1150 and the color pixel 1130. When the charge generation layer (CGL) 1140 is provided, if a voltage (e.g., a DC voltage of 2 to 10 V) is applied to the anode layer 1110 and the cathode layer 1160, electrons and holes may be discharged from the charge generation layer (CGL) 1140 to the electron injection layer (EIL) 1135 and the hole injection layer (HIL) 1151, respectively.

Figure 12:
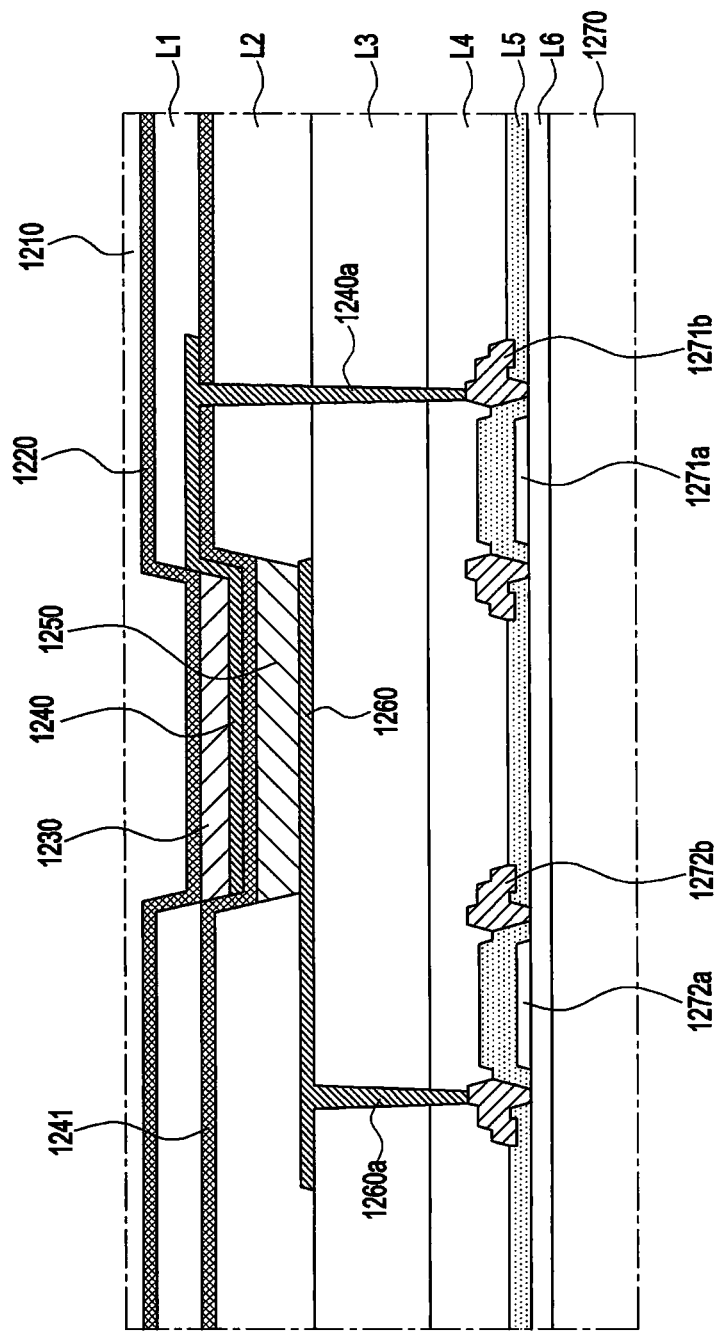
FIG. 12 is a diagram illustrating the cross-sectional structure of a display in which an element emitting light in an infrared band is arranged under a pixel emitting light in a visible band in a display according to various embodiments disclosed in the document.

FIG. 12 is a diagram illustrating the cross-sectional structure of a display in which an element emitting light in an infrared band is arranged under an element emitting light in a visible band in a display (e.g., the display 210) according to various embodiments disclosed in the document. Referring to FIG. 12, a display (e.g., the display 210) according to various embodiments disclosed in the document may include an encapsulation layer 1210, pixel definition layers L1 and L2, a planarization layer L3, and a first insulating layer L4, a thin film transistor (TFT) circuit pattern layer L5, a second insulating layer L6, and a substrate 1270.

According to an embodiment, the substrate 1270 may be formed of a material such as glass, plastic, silicone, or synthetic resin, and may have insulating properties.

According to an embodiment, the TFT circuit pattern layer L5 may be provided on the second insulating layer L6 arranged on the substrate 1270, and the TFT circuit pattern layer L5 may include a color pixel driving TFT and an infrared element driving TFT. According to an embodiment, the TFT circuit pattern layer L5 may include a color pixel driving TFT and an infrared element driving TFT, and the color pixel driving TFT and the infrared element driving TFT may include gate terminals (e.g., a color pixel driving gate terminal 1271a and an infrared element driving gate terminal 1272a) and drain terminals (e.g., a color pixel driving drain terminal 1271b and an infrared element driving drain terminal 1272b).

According to an embodiment, the TFT circuit pattern layer L5 may be insulated from the pixel definition layers L1 and L2 by the first insulating layer L4.

According to an embodiment, the pixel definition layers L1 and L2 may include a color pixel definition layer L1 and an infrared element definition layer L2. In addition, the color pixel definition layer L1 may include a first cathode layer 1220, a color pixel layer 1230, and a first anode layer 1240, and the infrared element definition layer L2 may include a second cathode layer 1241, an infrared element layer 1250, and a second anode layer 1260.

The pixel definition layers L1 and L2 may have through-vias (e.g., a first anode through-via 1240a and a second anode through-via 1260a) formed such that the first anode layer 1240 and the second anode layer 1260 are exposed to the planarization layer L3, which may be connected to the color pixel driving TFT and the infrared element driving TFT, respectively, through the through-vias (e.g., the first anode through-via 1240a and the second anode through-via 1260a). According to various embodiments, the anode layer and the cathode layer may replace each other in their roles depending on a driving method of the organic light-emitting diode (OLED). For example, a hole may be injected to the anode layer and an electrode may be injected to the cathode layer according to an embodiment, or an electron may be injected to the anode layer and a hole may be injected to the cathode layer according to another embodiment. The various embodiments disclosed in the document are not limited to those shown in the above-described embodiments and drawings in relation to the arrangement of the anode layer and the cathode layer.

As described above with reference to FIG. 11, the color pixel and the infrared elements belonging to the pixel definition layers L1 and L2 may further include hole injection layers (e.g., hole injection layers 1131 and 1151), hole transport layers (e.g., hole transport layers 1132 and 1152), organic emission layers (e.g., organic emission layers 1133 and 1153), electron transport layers (e.g., electron transport layers 1134 and 1154), and electron injection layers (e.g., electron injection layers 1135 and 1155), and may emit light having a wavelength in a visible band and light having a wavelength in an infrared band using the same.

Figure 13:
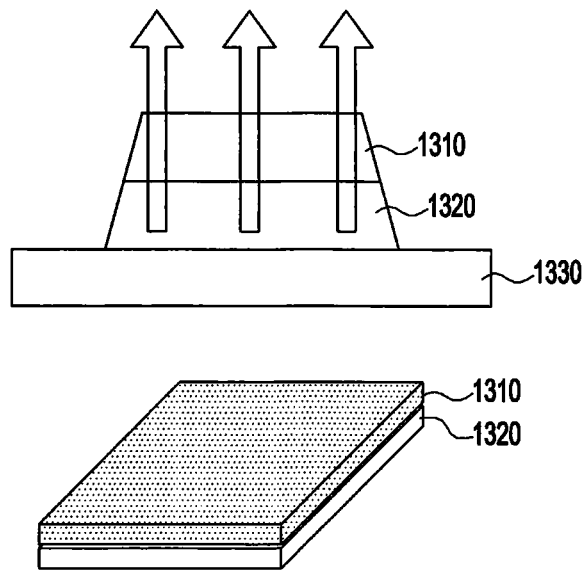
FIG. 13 is a diagram schematically illustrating the state in which infrared light is transmitted in the case where an element emitting light in an infrared band is arranged under a pixel emitting light in a visible band in a display according to an embodiment disclosed in the document.
Figure 14:
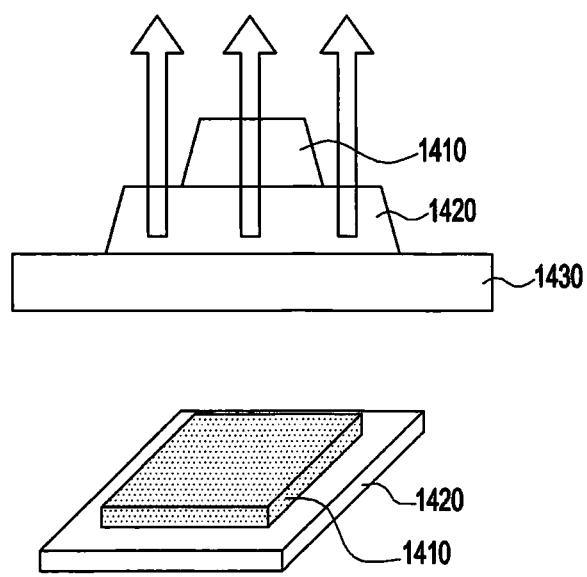
FIG. 14 is a diagram schematically illustrating the state in which infrared light is transmitted in the case where an element emitting light in an infrared band is arranged under a pixel emitting light in a visible band in a display according to another embodiment disclosed in the document.

FIG. 13 is a diagram schematically illustrating the state in which infrared light is transmitted in the case where an element emitting light in an infrared band is arranged under a pixel emitting light in a visible band in a display (the display 210) according to an embodiment disclosed in the document. FIG. 14 is a diagram schematically illustrating the state in which infrared light is transmitted in the case where an element emitting light in an infrared band is arranged under a pixel emitting light in a visible band in a display (the display 210) according to another embodiment disclosed in the document. A schematic manufacturing process and an embodiment of a color pixel and an infrared element may be described with reference to FIGS. 13 and 14

Referring to FIGS. 13 and 14, in various embodiments disclosed in the document for manufacturing an OLED, since an infrared element is arranged under a color pixel, an organic material constituting the color pixel 1310 or 1410 may be deposited after depositing an organic material constituting the infrared element 1320 or 1420 on a substrate 1330 or 1430. Although the stacked structure in which the infrared element 1320 or 1420 is arranged under the color pixel 1310 or 1410 may be conceptually represented as lower diagrams in FIGS. 13 and 14, if the infrared element 1320 or 1420 is preferentially deposited and the color pixel 1310 or 1410 is then deposited in the manufacturing process, the stacked structure thereof may be formed similarly to the trapezoidal shape as shown in FIGS. 13 and 14.

Referring to FIG. 13, since the infrared element 1320 is positioned at a lower portion of the stacked structure according to various embodiments, if infrared light is emitted in the stacked direction of the layers (for example, in the direction of the arrow shown in FIG. 14), the emitted infrared light is not greatly distorted by the organic material of the color pixel 1310 arranged thereon. However, the transmittance of light may be slightly lowered compared to the case where no configuration is provided on the infrared element 1320. Accordingly, according to various embodiments disclosed in the document, the color pixel 1410 may be deposited on the infrared element 1420 so as to cover a portion of the upper surface of the infrared element 1420, instead of the entire area of the upper surface thereof, as shown in FIG. 14. Alternatively, the deposition area may be further expanded in the deposition process of the infrared element 1420. As a result, the area of the upper surface of the infrared element 1420 may be greater than the area of the lower surface of the color pixel 1410, thereby improving the transmittance of light in the infrared element 1420.

Hereinafter, the light having a wavelength in an infrared band, emitted from the infrared element, according to various embodiments disclosed in the document may be described in detail with reference to FIG. 15.

Figure 15:
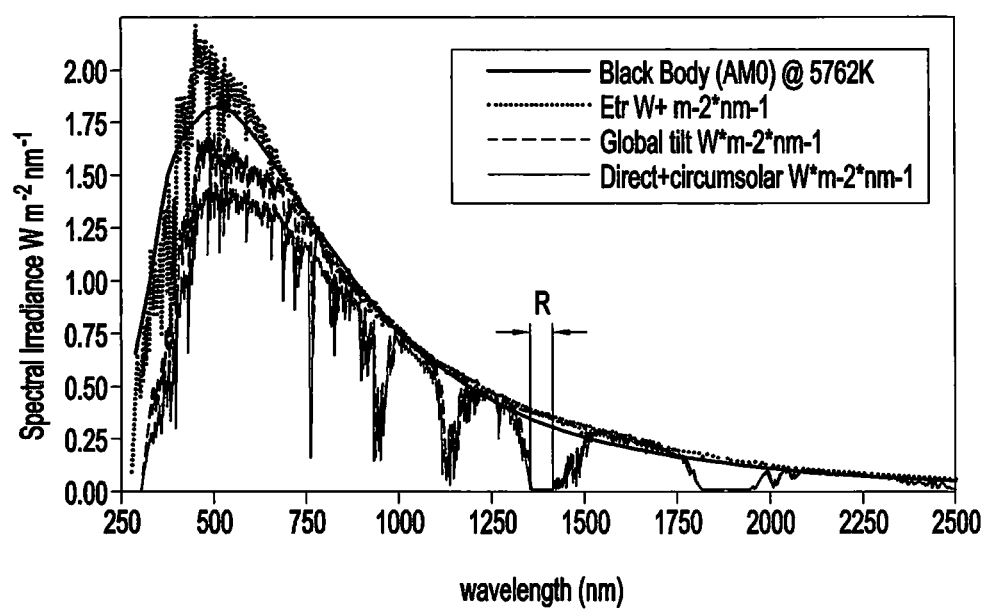
FIG. 15 is a graph showing applicable infrared bands in an electronic device according to various embodiments disclosed in the document.

FIG. 15 is a graph showing applicable infrared bands in an electronic device (e.g., the electronic device 101) according to various embodiments disclosed in the document. The graph in FIG. 15 may represent the spectrum of sunlight reaching the ground. As described above with reference to FIG. 9, the infrared element according to various embodiments disclosed in the document may emit infrared light having a band (e.g., a band of about 1200 nm or more) in which a thin film transistor for the color pixel does not react thereto. For example, the light in an infrared band, emitted from the infrared element, may be light in a specified band in which the color pixel (e.g., the first element or the third element) does not substantially react to. According to this, in the case where both visible light and infrared light are emitted, it is possible to minimize the influence of the visible light on the organic material using the infrared light and to prevent malfunction of the organic light-emitting diode (OLED) due to the photoelectric effect of the transistor, which may occur when light in an infrared band of less than 1200 nm (e.g., 750 to 800 nm) is emitted.

As another embodiment disclosed in the document, the infrared element may be configured to emit light in a band in which infrared light contained in the sunlight is absorbed into the air. For example, the band of infrared light emitted from the infrared element may be set to about 1350 nm to about 1400 nm.

For reference, the thick solid line in FIG. 15 may represent the theoretical spectrum of a black body at a specific temperature (about 5762K), the dotted line in FIG. 15 may represent the amount of sunlight in the upper atmosphere, and the alternated long and short dash line in FIG. 15 may represent the amount of sunlight reaching the sea level. The sunlight reaching the sea level (or the ground) contains a significant amount of infrared light in a band of about 750 to 800 nm. According to an embodiment, if infrared light having a band of about 750 to 800 nm is emitted from the display and irradiated to an object, it may not show the effect of infrared emission from the electronic device because the amount of infrared light included in the incident sunlight is greater than the amount of infrared light emitted from the electronic device (e.g., saturation). In this case, it may be impossible to accurately recognize the depth of the object to be identified (e.g., the shapes of ridge portions and valley portions in a finger).

Figure 16:
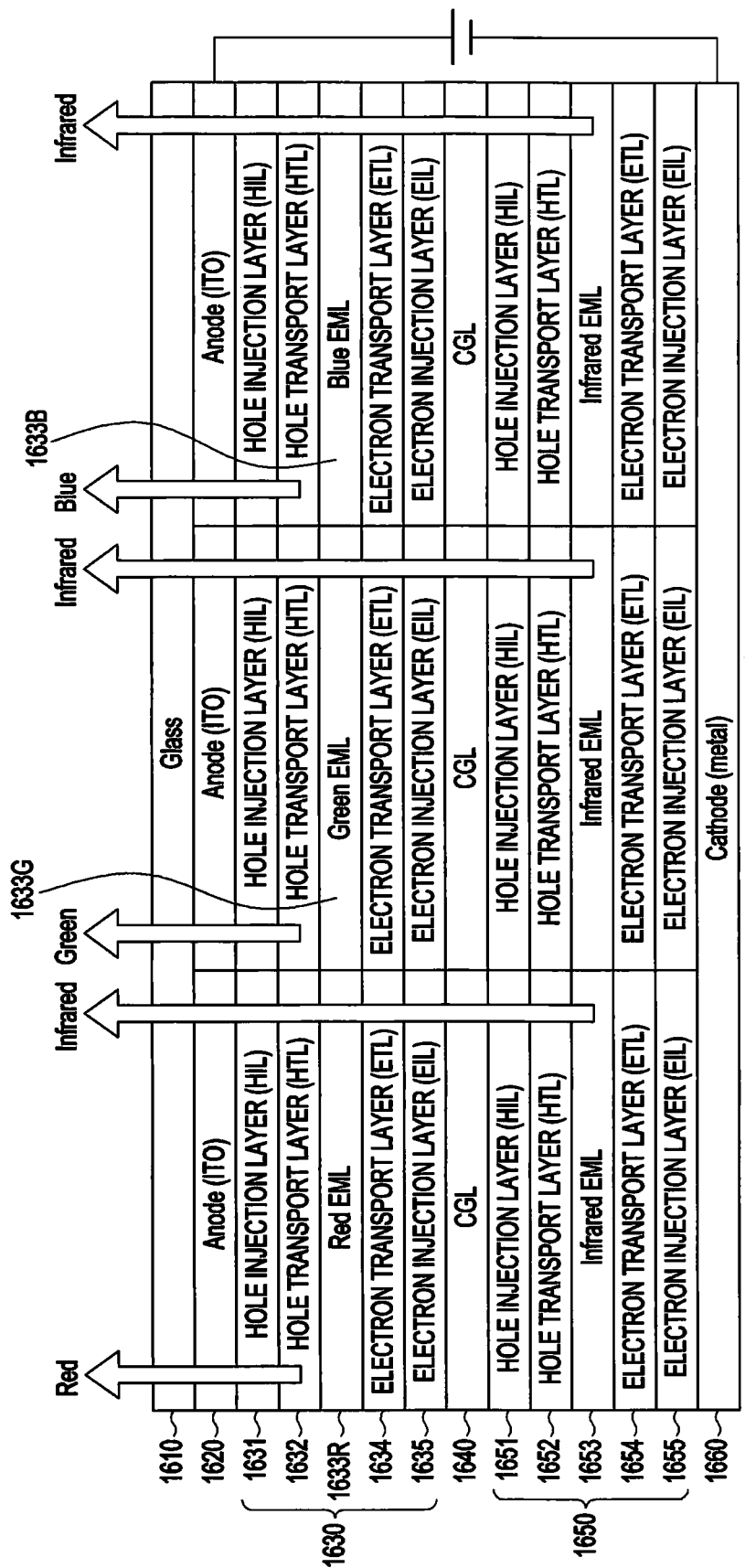
FIG. 16 is a diagram illustrating the state in which a charge generation layer is arranged between a pixel emitting light in a visible band and an element emitting light in an infrared band in a display according to various embodiments disclosed in the document.

FIG. 16 is a diagram illustrating the state in which a charge generation layer 1640 is arranged between a pixel emitting light in a visible band and a pixel emitting light in an infrared band in a display (e.g., the display 210) according to various embodiments disclosed in the document. Referring to FIG. 16, a display (e.g., the display 210) according to various embodiments disclosed in the document may include glass 1610, an anode layer 1620 (e.g., an ITO), a cathode layer 1660 (e.g., metal), and an organic emission layer. This configuration may be provided to each color subpixel.

Specifically, the organic emission layer may be formed in a structure in which a hole injection layer (HIL) 1631, a hole transport layer (HTL) 1632, an organic emission layer (EML) 1633, an electron transport layer (ETL) 1634, and an electron injection layer (EIL) 1635 are stacked. Holes injected from the anode layer 1610 and electrons injected from the cathode layer 1660 are transferred through the transport paths (HTL and ETL), and are then combined in the organic emission layer to generate excitons so that light having a specific wavelength is emitted from the organic emission layer (EML) by the energy from the generated excitons. A red-light organic emission layer (Red EML), a green-light emission layer (Green EML), and a blue-light emission layer (Blue EML) may be formed in the same structure as the organic emission layer (EML). According to an embodiment, the infrared element 1650 may also be formed in the same structure as the organic emission layer structure of the color subpixel. For example, the infrared element 1650 may also be formed in a structure in which hole injection layer (HIL) 1651, a hole transport layer (HTL) 1652, an organic emission layer (EML) 1653, an electron transport layer (ETL) 1654, and an electron injection layer (EIL) 1655 are stacked.

Referring to FIG. 16, the infrared elements may be arranged under all of the color subpixels. According to various embodiments, a partition wall (not shown) may be provided between the color subpixels such that the light emitted from the infrared emission layer (infrared EML) may travel straight in one direction.

Figure 17:
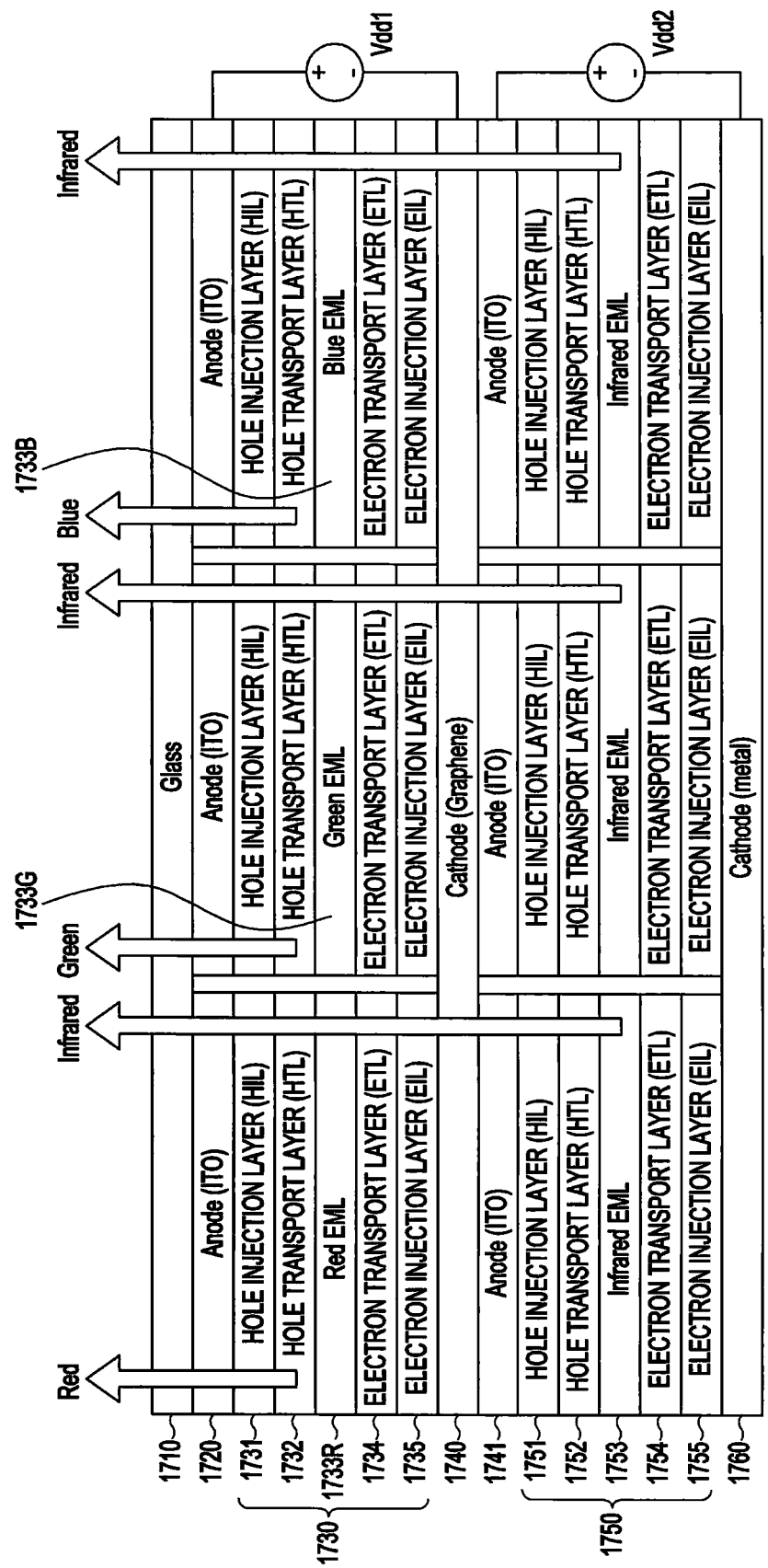
FIG. 17 is a diagram illustrating the state in which a power line is independently connected to a pixel emitting light in a visible band and an element emitting light in an infrared band in a display according to various embodiments disclosed in the document.

FIG. 17 is a diagram illustrating the state in which power lines for driving a pixel emitting light in a visible band and an element emitting light in an infrared band are independently connected thereto in a display (e.g., the display 210) according to various embodiments disclosed in the document.

Figure 18:
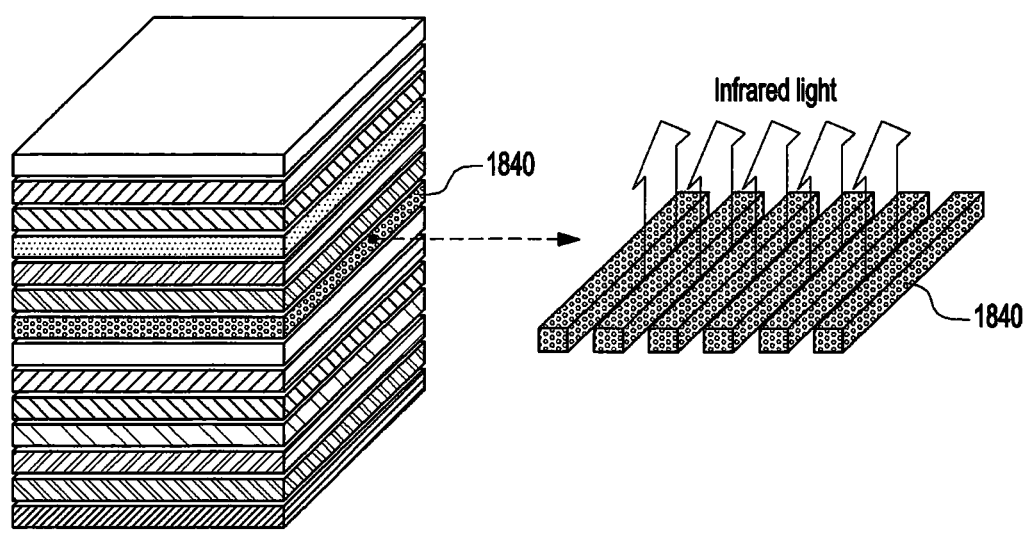
FIG. 18 is a diagram illustrating the state in which light in an infrared band passes through a cathode layer included in a layer emitting light in a visible band in a display according to various embodiments disclosed in the document.

The display (e.g., the display 210) according to an embodiment illustrated in FIG. 17 may include cover glass 1710, an anode layer 1720 (e.g., an ITO), a cathode layer 1760 (e.g., metal), and an organic emission layer, and may be formed in a structure similar to that illustrated in FIG. 16. The display (e.g., the display 210) according to an embodiment illustrated in FIG. 17 may control light-emitting independently because the color pixel 1730 and the infrared element 1750 are connected to a driving power source through different lines, which is different from the embodiment illustrated in FIG. 16 in which one anode layer 1620 and one cathode layer 1660 are provided and in which the discharge of electrons and holes is induced through the charge generation layer (CGL) 1640 provided therebetween. For example, the organic emission layer for the color pixel may be connected to the anode layer 1720 and the cathode layer 1740, and the organic emission layer for the infrared element may be connected to the anode layer 1741 and the cathode layer 1760. Accordingly, the color pixel and infrared element may emit light independently. For example, light-emitting of the color pixels is induced in order to display an image on the screen, and if fingerprint recognition is required, only light in an infrared band may be emitted from the infrared element. According to an embodiment, the infrared element may be operated even if the color pixel is in an off state (e.g., always-on display). That is, the infrared element may be activated and operated while the color pixel is in an inactive state. FIG. 18 is a diagram illustrating the state in which light in an infrared band passes through a cathode layer included in a pixel layer emitting light in a visible band in an electronic device (e.g., the electronic device 101) according to various embodiments disclosed in the document. According to various embodiments disclosed in the document, in the case where an infrared element and a color pixel are stacked up and down, the light transmission hole (or an opening) may be formed in a charge generation layer 1840 positioned between the infrared element and the color pixel in order to increase the transmission of infrared light. The light transmission hole may have various forms according to various embodiments. For example, the light transmission hole may have the shape of stripes as shown in FIG. 18, or may have the shape of a mesh different from the same. According to various embodiments, the charge generation layer 1840 in FIG. 18 may correspond to the charge generation layer (e.g., 1640) in FIG. 16 or the cathode layer (e.g., 1740) and/or the anode layer 1741 in FIG. 17.

According to an embodiment, in order to increase the light transmittance of the charge generation layer 1840, the charge generation layer 1840 may be made of a material including transparent graphene rather than metal such as a normal cathode layer.

Figure 19:
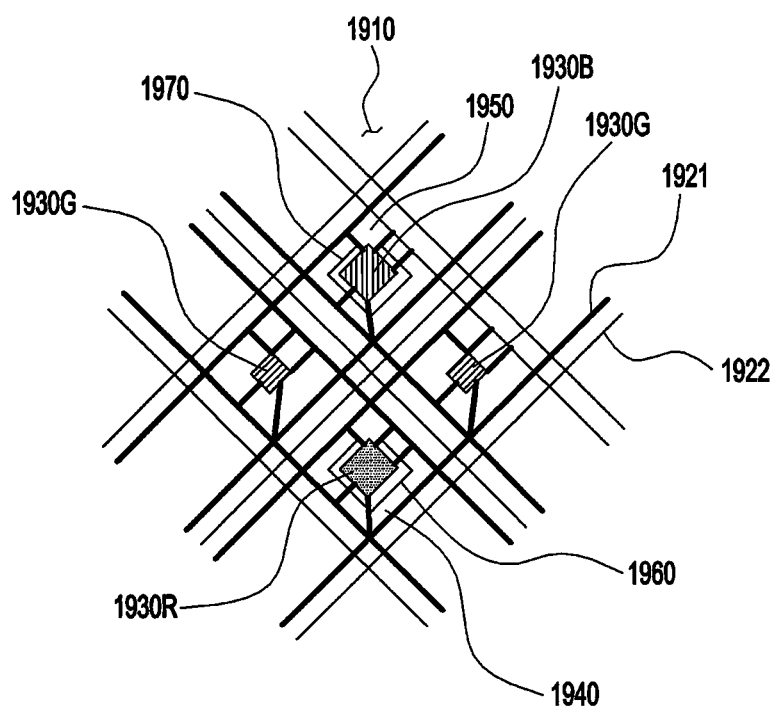
FIG. 19 is a diagram illustrating an OLED of a display viewed from above according to various embodiments disclosed in the document.
Figure 20:
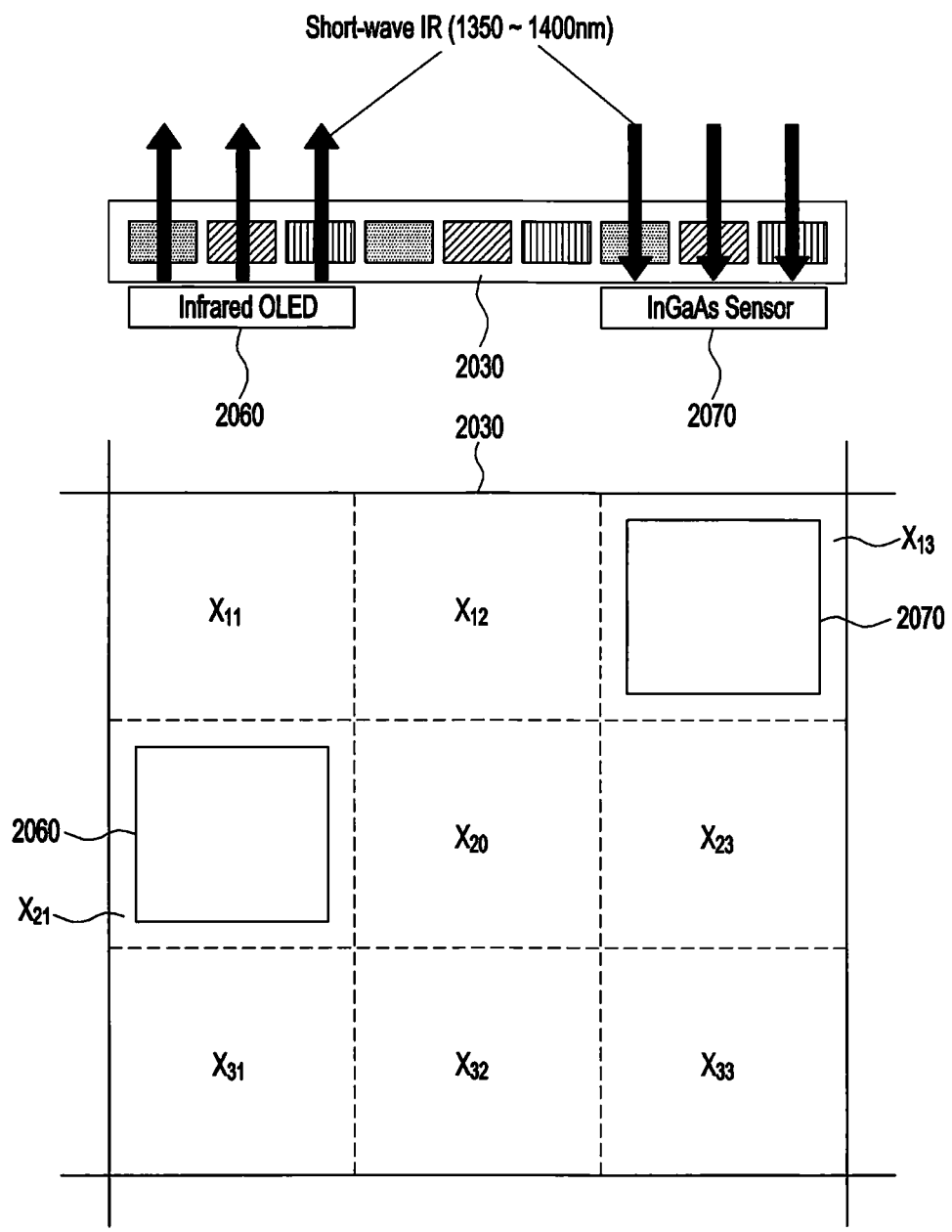
FIG. 20 is a diagram illustrating the state in which an infrared sensor is arranged in a display according to various embodiments disclosed in the document.

FIG. 19 is a diagram illustrating an OLED structure of a display (e.g., the display 210) viewed from above according to various embodiments disclosed in the document. FIG. 20 is a diagram illustrating the state in which an infrared sensor is arranged in a display (e.g., the display 210) according to various embodiments disclosed in the document.

Referring to FIG. 19, the pixel structure 1910 of the display (e.g., the display 210) according to various embodiments disclosed in the document may include, for example, a plurality of color subpixels 1930R, 1930G, and 1930B, a plurality of signal lines 1921 and 1922 that connect the plurality of color subpixels 1930R, 1930G, and 1930B, and transparent areas 1940 having a specific transparency. For example, the plurality of color subpixels 1930R, 1930G, and 1930B may include a red-light subpixel 1930R, a green-light subpixel 1930G, a blue-light subpixel 1930B, and the like.

According to an embodiment, in manufacturing any one of the plurality of color subpixels 1930R, 1930G, and 1930B, it is possible to adjust the number of color subpixels that constitute a unit pixel and the size of the color subpixel (or the surface area that emits light) in consideration of the brightness of each color subpixel. For example, one red-light subpixel 1930R and one blue-light subpixel 1930B may be provided, two green-light subpixels 1930G may be provided, and the blue-light subpixel 1930B may be formed to be greater than the green-light subpixel 1930G. However, the subpixels are not limited thereto, and may have different configuration from that illustrated in the diagram.

The red-light subpixel 1930R, the green-light subpixel 1930G, and the blue-light subpixel 1930B may operate as a single pixel. The signal lines 1921 and 1922 may include, for example, a display line 1921 for controlling light emission of the subpixels and a touch line 1922 related to touch sensing. As illustrated in the diagram, the areas in which the subpixels 1930R, 1930G, and 1930B and the signal lines 1921 and 1922 are not arranged may be configured as transparent areas 1940. The light emitted from the subpixels 1930R, 1930G, and 1930B may be transmitted to a biometric sensor (e.g., the biometric sensor 450) through the transparent areas 1940. For example, in the case where the biometric sensor (e.g., biometric sensor 450) is arranged on the rear surface of the display (e.g., the display 210), the light passing through the pixels arranged in a fingerprint verification area, in which the biometric sensor is positioned, or the pixels around the fingerprint verification area may reach the biometric sensor through the transparent areas (e.g., 1940 in FIG. 19) between the signal lines (e.g., 1921 and 1922 in FIG. 19).

Referring to the pixel structure of the display in FIG. 19, the display (e.g., the display 210) according to various embodiments may further include a transistor area 1950. According to an embodiment, additionally or alternatively, the display may further include an infrared element area 1960 for outputting a wavelength in an infrared band and a light reception area 1970 for receiving the light emitted from the infrared pixel and reflected from an external object. An infrared element may be arranged inside the infrared element area 1960, and a light receiver may be arranged inside the light reception area 1970. For example, the electronic device using an OLED display, as shown in the embodiment illustrated in FIG. 19, may include a transistor area 1950 for driving the organic emission layer and a signal line for driving a transistor. According to an embodiment, the signal line for driving a transistor may be included in the display line 1921 for controlling the emission of light in FIG. 19.

In various embodiments disclosed in the document, the infrared element area 1960 may be arranged under at least a portion of the color subpixel. Corresponding thereto, a light receiver for receiving light in an infrared band reflected by an external object may also be arranged under the color subpixel as shown in FIG. 19 and FIG. 20. FIG. 20 may show an infrared element area 2060 and a light reception area 2070 formed under a color subpixel layer 2030.

Both the infrared element area and the light reception area according to an embodiment disclosed in the document may be formed inside a unit pixel as shown in FIG. 19. However, the disclosure is not limited thereto. For example, the infrared element area and the light reception area may be formed inside different unit pixels, instead of being formed together inside the same unit pixel, as shown in FIG. 20.

Specifically, referring to the lower diagram in FIG. 20, the color subpixel layer 2030 may include a plurality of unit pixels X11 to X33, etc. The infrared element area including the infrared element may be formed in one of the plurality of unit pixels, and the light reception area may be formed in another of the unit pixels. The positions of the areas in which the infrared element area and/or the light reception area are formed and the number of the areas are not limited. That is, another infrared element area 2060 and another light reception area 2070 may be formed in other areas among the plurality of unit pixels.

When infrared light in a band of about 1200 nm or more (e.g., a band of 1350 nm to 1400 nm, etc.) is incident on the light receiver (e.g., an infrared sensor) arranged in the light reception area 2070, even if an organic material (e.g., the color pixel) is arranged in the path of the infrared light, the organic material may have little effect on the infrared light. Accordingly, the light receiver may be arranged at the lower portion of the display. As an example of the light receiver that is arranged in the light reception area 2070, for example, an indium gallium arsenide sensor (InGaAs sensor) may be arranged.

Figure 21:
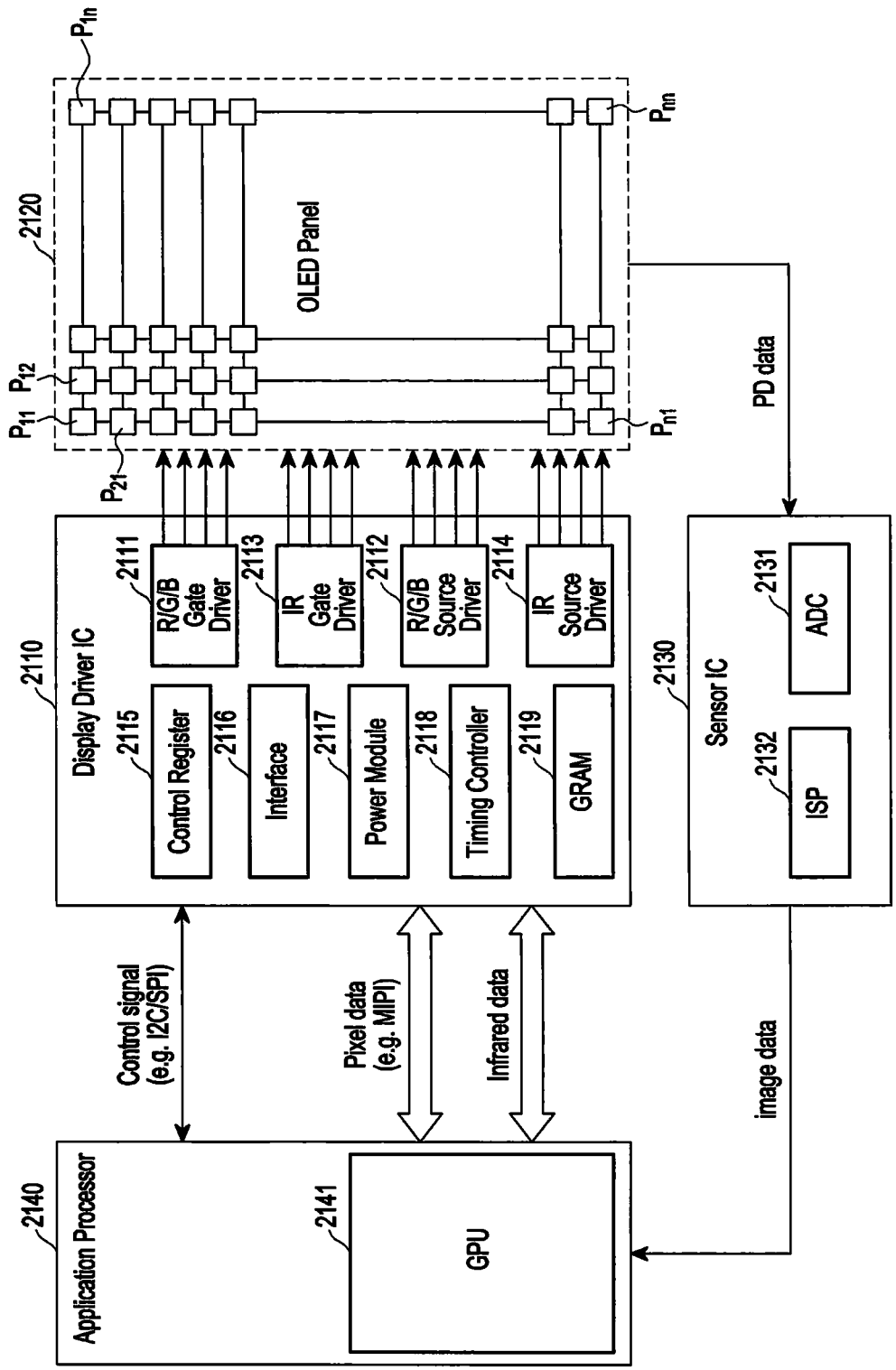
FIG. 21 is a control flow diagram of an electronic device according to various embodiments disclosed in the document.

FIG. 21 is a control flow diagram of a display (e.g., the display 210) according to various embodiments disclosed in the document.

Referring to FIG. 21, the display (e.g., the display 210) according to various embodiments disclosed in the document may be controlled by a display control system (or an image data processing system). The display control system may include an application processor 2140 (hereinafter, referred to as an "AP"), a display driver integrated circuit (IC) 2110 (hereinafter, referred to as a "DDI"), and a display panel 2120.

The AP 2140 according to various embodiments may control the overall operation of the display system. According to an embodiment, the AP 2140 may be implemented as a mobile AP. The DDI 2110 may process display data transmitted from the AP 2140, and may transmit the same to the display panel 2120. The display panel 2120 may display a screen according to the display data received from the DDI 2110.

The display (e.g., the display 210) according to various embodiments disclosed in the document or the electronic device (e.g., the electronic device 101) including the display may include an infrared element and a light receiver {e.g., a photodiode (PD)}. Accordingly, the infrared light received by the light receiver may be input as photodiode data (PD data) of the biometric sensor 2130 (e.g., the sensor module 176). The biometric sensor 2130 in the form of a module may include an analog-to-digital converter 2131 and/or an image signal processor 2132, and may generate image information from the photodiode data using the analog-to-digital converter 2131 and/or the image signal processor 2132 according to an embodiment. In addition, the image information generated by the biometric sensor 2130 may be transmitted back to the AP 2140.

The DDI according to various embodiments disclosed in the document may include a control register 2115, an interface 2116, a power module 2117, a timing controller 2118, a graphic memory (GRAM) 2119, color pixel gate/source drivers 2111 and 2112, infrared pixel gate/source drivers 2113 and 2114, and the like.

The control register 2115 may play the role of improving the image quality or shifting line data, and the interface 2116, which includes an interface circuit, may interface signals transmitted and received between the application processor 2140 and the DDI. The interface 2116 may generate a synchronization signal and/or a clock signal, and may transmit the same to the color pixel gate/source drivers 2111 and 2112 and/or the infrared element gate/source drivers 2113 and 2114.

The power module 2117 may supply power to the pixel gate/source drivers, the display panel, and/or the like, and the timing controller 2118 may play the role of controlling the timing of the pixel gate/source drivers by delaying or advancing a gating signal of the pixel driving driver. The graphic memory 2119 may play the role of storing color (RGB) data and infrared data transmitted between the AP 2140 and the DDI 2110. According to various embodiments disclosed in the document, the graphic memory 2119 has a size capable of simultaneously storing color data and infrared data of one frame.

The display (e.g., the display 210) according to various embodiments disclosed in the document and the electronic device (e.g., the electronic device 101) including the display may be controlled by the display control system (or the image data processing system) shown in FIG. 21.

Figure 22:
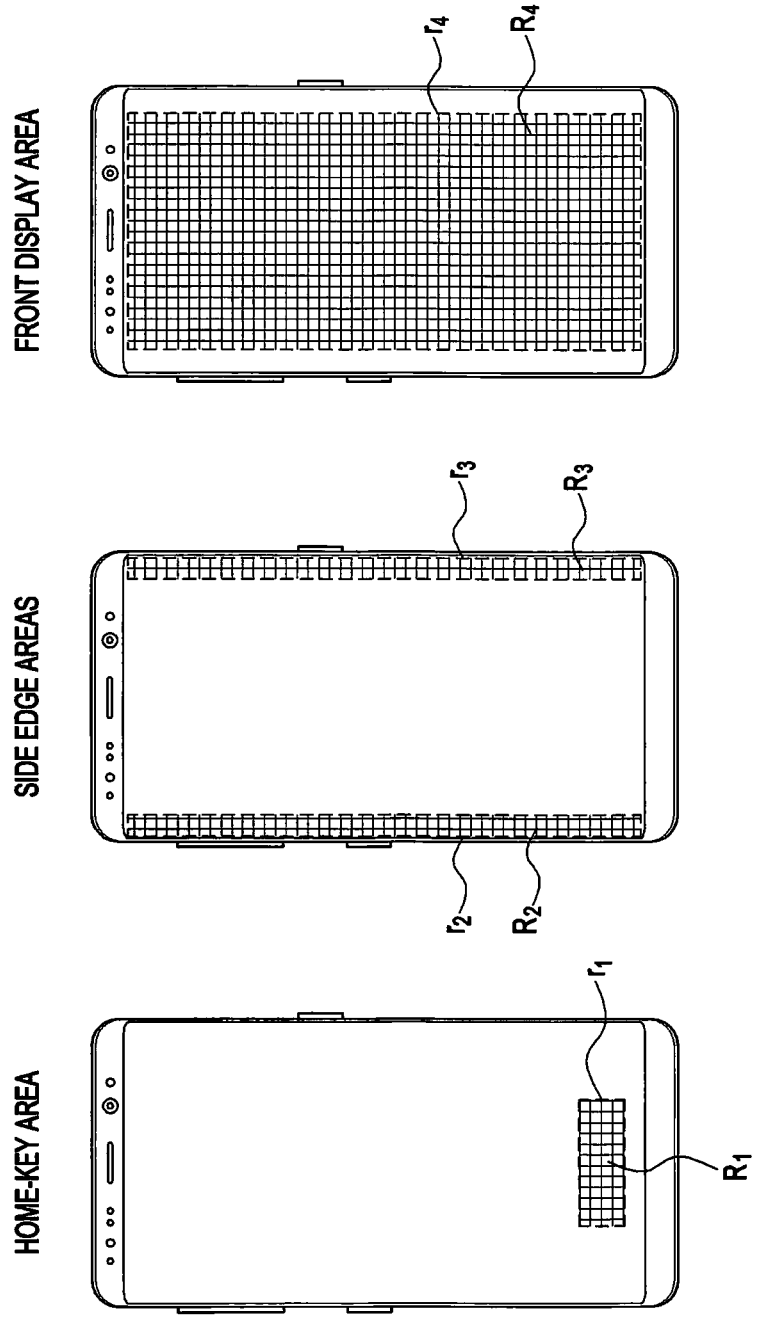
FIG. 22 is a diagram illustrating the state in which areas, in which infrared light is reflected by an external object and is sensed, are shown separately for respective display areas in an electronic device according to various embodiments disclosed in the document.

FIG. 22 is a diagram illustrating the state in which portions, in which the light emitted from an infrared element is reflected by an external object and is sensed, are divided into respective areas of a display (e.g., the display 210) in an electronic device (e.g., the electronic device 101) according to various embodiments disclosed in the document.

Referring to FIG. 22, a portable terminal provided with a display (e.g., the display 210) is illustrated as an electronic device (e.g., the electronic device 101). According to various embodiments, a fingerprint verification area R1 may be configured inside an area of the display, for example, an area r1 including at least a portion of a home-key area. Alternatively, a fingerprint verification area R2 or R3 may be configured inside an area r2 or r3 including at least a portion of side edge areas of the display, and a fingerprint verification area R4 may be configured in an area r4 including at least a portion of a front display area according to an embodiment. The display (e.g., the display 210) including the infrared element according to various embodiments disclosed in the document may be provided in at least one of the fingerprint verification areas R1, R2, R3, and R4.

Figure 23:
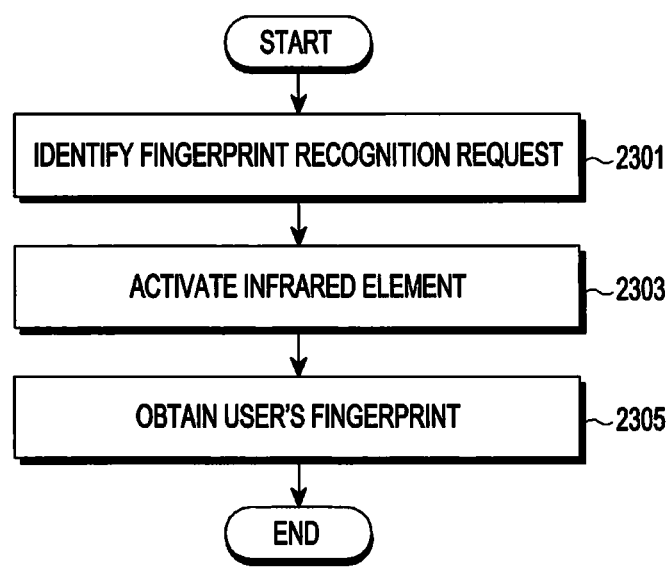
FIG. 23 is a diagram illustrating an operation method of an electronic device according to various embodiments disclosed in the document.

FIG. 23 is a diagram illustrating an operation method of an electronic device (e.g., the electronic device 101) according to various embodiments disclosed in the document.

Referring to FIG. 23, according to an operation method of an electronic device (e.g., the electronic device 101) including a display (e.g., the display 210) in at least a portion of which one or more pixels are stacked according to various embodiments disclosed in the document and an infrared element is arranged such that at least a portion thereof overlaps the pixels, in relation to operation 2301, if an event occurs, a processor (e.g., the processor 120) of the electronic device may identify whether or not the event is related to a fingerprint recognition request.

If the event is not related to a fingerprint recognition request, the processor (e.g., the processor 120) may enable the electronic device (e.g., the electronic device 101) to perform a specified function for an event that is not related to the fingerprint recognition request. The event that is not related to the fingerprint recognition request may be, for example, an event such as an operation of turning on/off a home screen of the display according to a side key input, activation of a camera, or the like.

According to various embodiments, the event related to a fingerprint recognition request may correspond to a situation in which fingerprint recognition is required, such as the case in which user authentication is required for a corresponding electronic device when turning on/off the electronic device (e.g., the electronic device 101), the case in which user authentication is required for a payment process for contents or financial products, or the like.

According to various embodiments disclosed in the document, in relation to operation 2303, the processor (e.g., the processor 120) may activate an infrared element. For example, if a user's finger is positioned in at least a portion of the display (e.g., the display 210) of the electronic device (e.g., the electronic device 101), the infrared element corresponding to the area where the finger is positioned may be activated.

According to an embodiment, an area in which a user's finger is required to be positioned for fingerprint recognition may be pre-configured in the electronic device (e.g., the electronic device 101), and when the fingerprint recognition is requested, the data indicating the area in which the user's finger is required to be positioned may be displayed on the display (e.g., display 210) of the electronic device.

If the electronic device (e.g., the electronic device 101) fails to perform touch recognition, the processor (e.g., the processor 120) may repeat the above operation. For example, in the case in which the finger is not positioned in the display area capable of sensing a fingerprint, the electronic device (e.g., the electronic device 101) may return to the fingerprint recognition request operation (e.g., operation 2301), thereby performing again the operation method of the electronic device (e.g., the electronic device 101) according to various embodiments disclosed in the document.

In relation to operation 2303, if the infrared element is activated and an actual touch is detected, the electronic device (e.g., the electronic device 101) may perform user authentication through the processor (e.g., the processor 120). For example, the light having a wavelength in an infrared band, emitted from the infrared element, may be reflected by a user's finger and received by a light receiver provided in a biometric sensor (e.g., the biometric sensor 450), and the biometric sensor (e.g., the biometric sensor 450) may transmit, to a DDI, image information corresponding to the light incident on the light receiver. The processor (e.g., the processor 120) may compare the generated image information with an image previously stored, thereby performing user authentication.

In relation to operation 2305, according to various embodiments, the infrared element and the color pixel in the area including the infrared element may be operated independently of each other. According to an embodiment, the operation of activating the infrared element may include an operation of deactivating at least one pixel.

For example, the color pixel may be activated along with the operation of activating the infrared element. In addition, according to an embodiment, the operation of activating the infrared element may include an operation of deactivating the color pixel in the area including the infrared element.

In relation to operation 2305, when the infrared element is activated, the light in an infrared band, emitted from the infrared element, may be configured to have a wavelength of about 1200 nm or more. According to this, a silicon-based color pixel transistor may be prevented from reacting thereto. Since the display including the infrared element according to various embodiments disclosed in the document and the electronic device including the display may provide an improved external object recognition function, they may be applied to air gesture and iris scanner technology, as well as the fingerprint recognition function described above.

The display and the electronic device according to an embodiment disclosed in the document may be applied to solar charging technology for storing energy of sunlight using a light receiver for receiving light in a visible band and/or light in an infrared band, and may be applied to a thermometer for measuring the body temperature, as well as infrared data association communication (IrDA).

Figure 24:
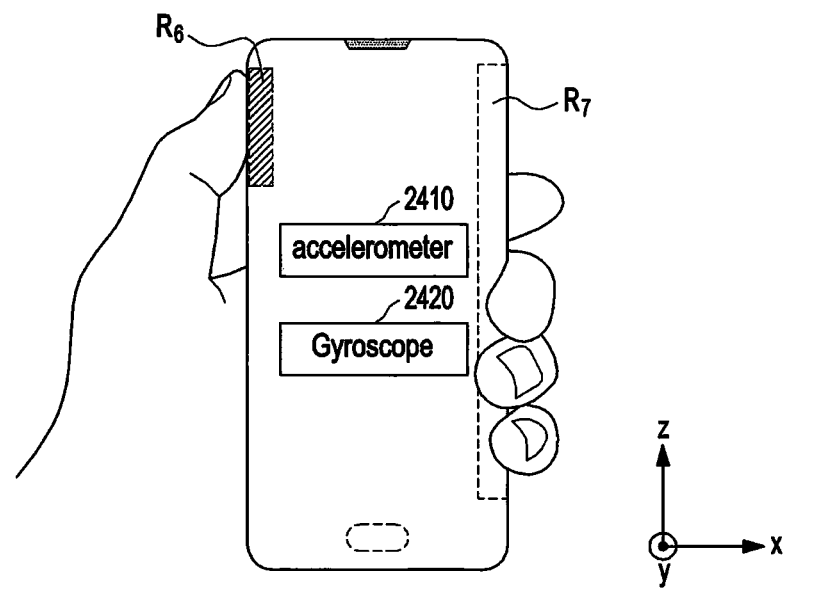
FIG. 24 is a diagram illustrating the state in which infrared emission and reception areas are adjusted depending on a terminal direction of an electronic device according to various embodiments disclosed in the document.
Figure 24:
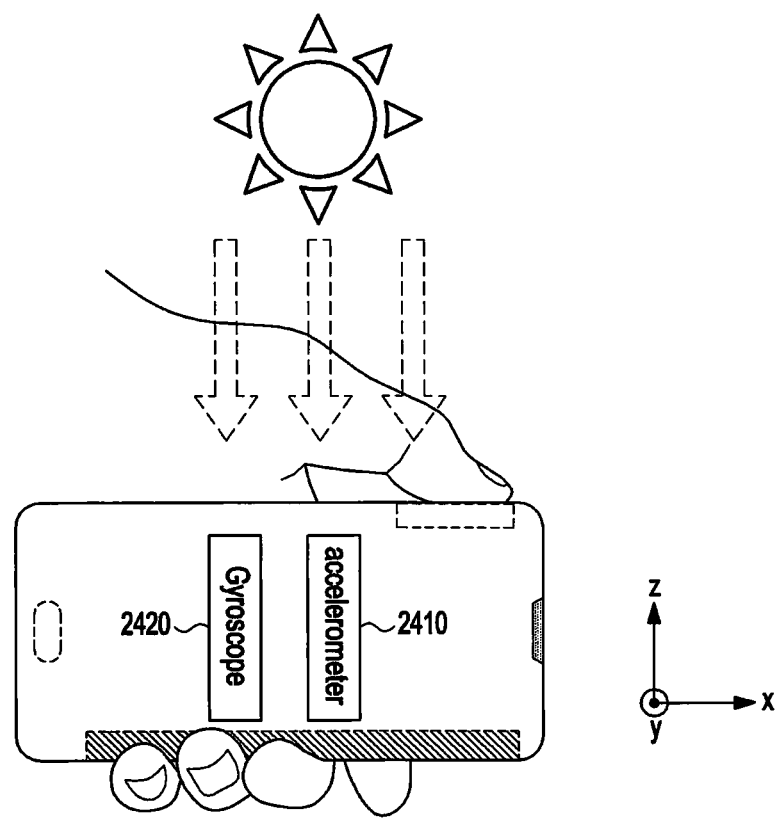

FIG. 24 is a diagram illustrating the state in which infrared emission and reception areas are adjusted depending on a terminal direction of an electronic device (e.g., the electronic device 101) according to various embodiments disclosed in the document.

Referring to FIG. 24, the electronic device (e.g., the electronic device 101) according to various embodiments disclosed in the document may detect the operation state of the electronic device (e.g., the degree of saturation of a light receiver that receives infrared light, the degree of tilt of the electronic device, etc.) or the external environmental state (e.g., the method of gripping the electronic device by a user, the amount of sunlight, etc.), and may generate an electrical signal or a data value corresponding to the detected state.

For example, the electronic device (e.g., the electronic device 101) according to various embodiments may detect whether or not the light receiver for receiving infrared light is in a state capable of collecting the reflected light of the infrared light emitted from the display (e.g., the display 210), and may detect the rotational direction or the degree of tilt of the electronic device using an accelerometer 2410 and/or a gyroscope 2420. The electronic device (e.g., the electronic device 101) according to an embodiment may detect how the user grips the electronic device using a grip sensor or the like, and may detect the amount of sunlight or the like using an illuminance sensor or the like.

According to an embodiment, in the electronic device (e.g., the electronic device 101) capable of recognizing a fingerprint in a plurality of areas (e.g., R6 and R7), if any one of the light receivers of the biometric sensors (e.g., the biometric sensors 450) included in the plurality of areas (e.g., R6 and R7) enters into a saturation state and is unable to effectively collect the reflected light of the infrared light emitted from the display, the electronic device may selectively adjust the infrared emission and reception areas for fingerprint recognition. According to an embodiment, it is possible to measure the rotational direction or the degree of tilt of the electronic device in real time using the accelerometer 2410 and/or the gyroscope 2420, thereby selectively adjust the infrared emission and reception areas for fingerprint recognition according to the direction of the electronic device (e.g., a terminal). According to an embodiment, in the electronic device capable of recognizing a fingerprint in a plurality of areas (e.g., R6 and R7), if the electronic device is measured to be parallel to the z-axis, which is a virtual coordinate axis, based on the information measured by the accelerometer 2410 or the gyroscope 2420 of the electronic device, some (e.g., R6) of the plurality of infrared emission and reception areas for fingerprint recognition may be activated. For example, if the electronic device is measured to be parallel to the x-axis, which is a virtual coordinate axis, based on the information measured by the accelerometer 2410 and the gyroscope 2420 of the electronic device, another area (e.g., R7), which is different from the area activated when the electronic device is parallel to the z-axis, may be activated.

According to an embodiment, in the electronic device (e.g., the electronic device 101) capable of fingerprint recognition in a plurality of areas (e.g., R6 and R7), the electronic device may detect the state of gripping the electronic device by a user, thereby selectively adjusting the infrared emission and reception areas for fingerprint recognition. For example, in the case where the electronic device (e.g., the electronic device 101) is configured to enable fingerprint recognition in a plurality of edge areas thereof, it is possible to allow infrared light to be emitted and received in the area that most facilitates fingerprint recognition in consideration of the area that the user's finger touches in the edge areas. According to an embodiment, in the electronic device (e.g., the electronic device 101) capable of fingerprint recognition in a. plurality of areas (e.g., R6 and R7), it is possible to measure the amount of sunlight incident on the electronic device and to selectively adjust the infrared emission and reception areas for fingerprint recognition, based on the measured amount of light. For example, a control algorithm for the infrared emission and reception areas may be operated at noon when there is much sunlight, and the control algorithm for the infrared emission and reception areas may be released in the evening when there is little sunlight.

According to an embodiment, the infrared emission and reception areas may be selectively adjusted depending on the operation state of the electronic device (e.g., the electronic device 101) or the external environment state. According to an embodiment, the infrared emission and reception areas may be selectively adjusted in consideration of both the operation state of the electronic device and the external environment state. According to this, it is possible to prevent degradation of a recognition rate of the biometric sensor in the area directly facing the incident direction of sunlight. As a result, it is possible to minimize current consumption due to repeated use of the biometric sensor areas having a low recognition rate.

Figure 25:
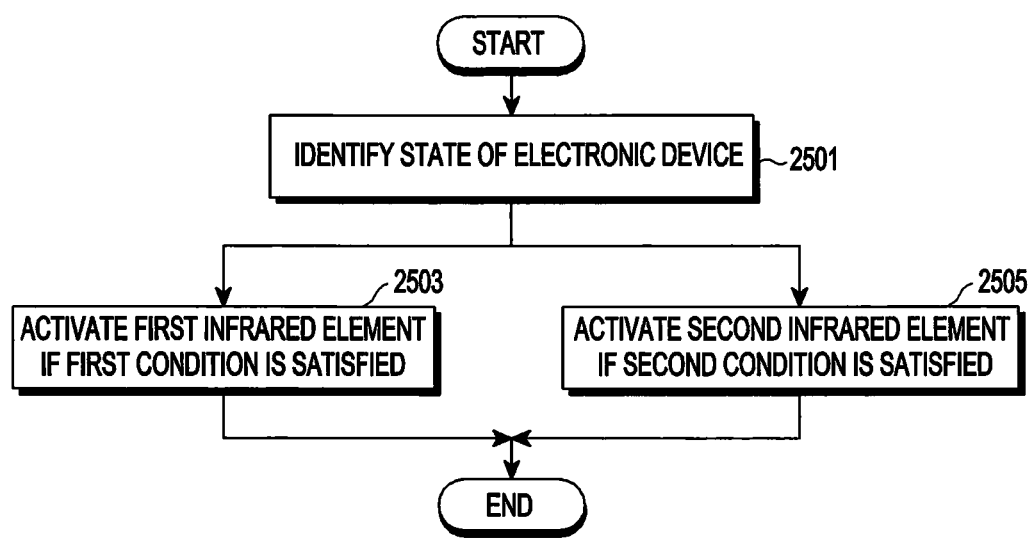
FIG. 25 is a diagram illustrating an operation of activating an infrared element in an electronic device according to various embodiments disclosed in the document.

FIG. 25 is a diagram illustrating an operation of activating infrared elements in an electronic device (e.g., the electronic device 101) according to various embodiments disclosed in the document.

According to various embodiments, the infrared elements may include a first infrared element arranged such that at least a portion thereof overlaps at least one first pixel in the first area (e.g., R6) of the display (e.g., the display 210) and a second infrared element arranged such that at least a portion thereof overlaps at least one second pixel in the second area (e.g., R7) of the display (e.g., display 210).

According to various embodiments, the operation of activating the infrared element (e.g., operation 2303) may include an operation of identifying the state of the electronic device (operation 2501), an operation of activating the first infrared element if the state of the electronic device satisfies a first condition (operation 2503), and an operation of activating the second infrared element if the state of the electronic device satisfies a second condition (operation 2505).

Referring to FIG. 25, the electronic device (e.g., the electronic device 101) according to various embodiments disclosed in the document may identify the state of the electronic device using a sensor module (e.g., the sensor module 176) in relation to operation 2501. Here, the state of the electronic device may denote the operation state of the electronic device (e.g., the electronic device 101) or an external environment state. According to an embodiment, both the operation state of the electronic device and the external environment state may be considered.

A processor (e.g., the processor 120) of the electronic device (e.g., the electronic device 101) may select a specific area among a plurality of fingerprint recognition areas in the display (e.g., the display 210) of the electronic device.

In some cases, a fingerprint recognition rate using infrared light may be very low in the area preconfigured for fingerprint recognition in consideration of the operation state of the electronic device (e.g., the electronic device 101) or the external environment state. According to an embodiment, if there is another area of the display (e.g., the display 210) in which a high fingerprint recognition rate is provided, the processor (e.g., the processor 120) may change the fingerprint recognition area to the corresponding area. According to an embodiment, if a fingerprint recognition rate using infrared light has an acceptable value as a result of identifying the state of the electronic device, the processor (e.g., the processor 120) may not change the fingerprint recognition area. According to an embodiment disclosed in the document, the electronic device (e.g., the electronic device 101) may change the fingerprint recognition area in consideration of the orientation (or the degree of tilt) of the electronic device and the incident direction of sunlight.

According to various embodiments disclosed in the document, it is possible to set conditions (e.g., a first condition and a second condition) for selectively activating one of a plurality of infrared elements (e.g., a first infrared element and a second infrared element) arranged separately in a plurality of areas. The conditions (e.g., the first condition and the second condition) may be configured to be distinguished depending on the rotational direction, the degree of tilt, the fingerprint recognition rate of the electronic device (e.g., the electronic device 101), or the like. According to this, if the rotational direction, the degree of tilt, and the fingerprint recognition rate of the electronic device (e.g., the electronic device 101) satisfy the first condition, the first infrared element may be activated, and if the rotational direction, the degree of tilt, and the fingerprint recognition rate of the electronic device satisfy the second condition, the second infrared element may be activated.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above. It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server. According to various embodiments, each component (e.g., a module or a program) of the above-described components may include a single entity or multiple entities.

According to various embodiments, one or more of the above-described components or operations may be omitted, or one or more other components or operations may be added. Alternatively or additionally, a plurality of components (e.g., modules or programs) may be integrated into a single component. in such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Various embodiments disclosed in the document may provide a display including: a substrate; a first element formed on the substrate and configured to emit light in a first visible band; a second element configured to emit light in an infrared band; and a third element configured to emit light in a second visible band, wherein at least a portion of the third element may be arranged to overlap on the second element.

According to various embodiments, the display may further include a fourth element configured to emit light in an infrared band, and at least a portion of the first element may be arranged to overlap on the fourth element.

According to various embodiments, a biometric sensor to acquire biometric information may be arranged.

According to various embodiments, the display may further include a light receiver configured to receive reflected light in an infrared band, which is emitted from the second element and reflected by an object outside the display.

According to various embodiments, at least a portion of the first element may be arranged to overlap on the light receiver According to various embodiments, the first element may display a specified color, and the third element may display a specified color different from the specified color.

According to various embodiments, the second element may emit infrared light in a specified band that the first element and the third element do not substantially react to.

According to various embodiments, the infrared light in the specified band may have a wavelength of 1200 nm or more.

According to various embodiments, wherein the second element may emit light in a specified band in which light in an infrared band of sunlight is absorbed into the air.

According to various embodiments, the infrared light in the specified band may have a wavelength of 1350 nm to 1400 nm.

According to various embodiments, a charge generation layer may be arranged in at least a portion of the area where the third element and the second element overlap.

According to various embodiments, the third element and the second element may be connected to different power lines, and the third element and the second element may independently emit light.

Various embodiments disclosed in the document may provide an electronic device including: a housing; a display mounted to at least one surface of the housing; a biometric sensor module configured to obtain information related to a user's fingerprint using at least a portion of light in a visible band or light in an infrared band emitted from the display; and a processor configured to perform authentication for a fingerprint, based at least in part on the information related to the user's fingerprint, wherein the display may include: a substrate; a color pixel formed on the substrate and configured to emit light in a visible band; and an infrared element arranged to overlap at least a portion of the color pixel and configured to emit light in an infrared band According to various embodiments, the display may be configured to independently emit light in an infrared band in order to perform a fingerprint recognition function.

According to various embodiments, the display may include a light receiver arranged on the substrate and configured to receive light in an infrared band According to various embodiments, the light receiver may include at least one guide wall configured to guide reflected light and at least one photodiode configured to receive the reflected light.

According to various embodiments, an infrared element configured to emit light in an infrared band and a light receiver configured to receive light in an infrared band may be provided in at least two areas, and the area emitting and receiving infrared light may be variable.

Various embodiments disclosed in the document may provide a method in an electronic device including a display in at least a portion of which at least one pixel is included and an infrared element arranged such that at least a portion thereof overlaps the at least one pixel, which includes: identifying a fingerprint identification request; activating the infrared element, based at least in part on the fingerprint recognition request; and obtaining a fingerprint of a user corresponding to the electronic device using the activated infrared element by the processor of the electronic device.

According to various embodiments, the activating of the infrared element may include activating the at least one pixel.

According to various embodiments, the infrared element may include at least a portion of a first infrared element stacked to overlaps at least one first pixel in a first area of the display and at least a portion of a second infrared element stacked to overlaps at least one second pixel in a second area of the display, and the activating of the infrared element may include: identifying a state of the electronic device; if the state of the electronic device satisfies a first condition, activating the first infrared element; and if the state of the electronic device satisfies a second. condition, activating the second infrared element.

The display according to various embodiments disclosed in the document described above and electronic devices including the same are not limited to the above-described embodiments and drawings, and it will be obvious to those skilled in the art that various substitutions, modifications, and changes thereof are possible within the scope disclosed in the document.

The invention claimed is:

1. A display comprising:
 a substrate;
 a first element formed on the substrate and configured to emit light in a first visible band;
 a second element configured to emit light in an infrared band; and
 a third element configured to emit light in a second visible band,
 wherein at least a portion of the third element is arranged to overlap on the second element.

2. The display of claim 1, further comprising a fourth element configured to emit light in an infrared band, wherein at least a portion of the first element is arranged to overlap on the fourth element.

3. The display of claim 1, wherein a biometric sensor to acquire biometric information is arranged.

4. The display of claim 1, further comprising a light receiver configured to receive reflected light in an infrared band, which is emitted from the second element and reflected by an object outside the display.

5. The display of claim 4, wherein at least a portion of the first element is arranged to overlap on the light receiver.

6. The display of claim 1, wherein the first element is configured to display a specified color, and wherein the third element is configured to display a specified color different from the specified color.

7. The display of claim 1, wherein the second element is configured to output infrared light in a specified band that the first element and the third element do not substantially react to, and wherein the infrared light in the specified band has a wavelength of 1200 nm or more.

8. The display of claim 1, wherein the second element is configured to output infrared light in a specified band in which light in an infrared band of sunlight is absorbed into the air, and wherein the infrared light in the specified band has a wavelength of 1350 nm to 1400 nm.

9. The display of claim 1, wherein a charge generation layer is arranged in at least a portion of the area where the third element and the second element overlap.

10. The display of claim 1, wherein the third element and the second element are connected to different power lines, and
 wherein the third element and the second element independently emit light.

11. The display of claim 4, wherein the light receiver comprises at least one guide wall configured to guide reflected light and at least one photodiode configured to receive the reflected light.

12. The display of claim 4, wherein the second element configured to emit light in an infrared band and a light receiver configured to receive light in an infrared band are provided in at least two areas, and wherein the area emitting and receiving infrared light is variable.

13. A control method of an electronic device comprising a display in at least a portion of which at least one pixel is included and an infrared element arranged such that at least a portion thereof overlaps the at least one pixel, the control method comprising:
 identifying a fingerprint identification request by a processor of the electronic device;
 activating the infrared element, based at least in part on the fingerprint recognition request by the processor of the electronic device; and
 obtaining a fingerprint of a user corresponding to the electronic device using the activated infrared element by the processor of the electronic device.

14. The control method of claim 13, wherein the activating of the infrared element comprises not activating the at least one pixel.

15. The control method of claim 13, wherein the infrared element comprises at least a portion of a first infrared element stacked to overlap at least one first pixel in a first area of the display and at least a portion of a second infrared element stacked to overlap at least one second pixel in a second area of the display, and
 wherein the activating of the infrared element comprises:
 identifying a state of the electronic device;
 if the state of the electronic device satisfies a first condition, activating the first infrared element; and if the state of the electronic device satisfies a second condition, activating the second infrared element.

* * * * *